United States Patent
Terui et al.

(10) Patent No.: US 9,066,435 B2
(45) Date of Patent: Jun. 23, 2015

(54) WIRING BOARD AND METHOD FOR MANUFACTURING THE SAME

(71) Applicant: IBIDEN CO., LTD., Ogaki-shi (JP)

(72) Inventors: Makoto Terui, Ogaki (JP); Daiki Komatsu, Ogaki (JP); Masatoshi Kunieda, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 61 days.

(21) Appl. No.: 13/853,227

(22) Filed: Mar. 29, 2013

(65) Prior Publication Data

US 2013/0258625 A1 Oct. 3, 2013

(30) Foreign Application Priority Data

Mar. 30, 2012 (JP) ................. 2012-083288

(51) Int. Cl.
*H05K 7/10* (2006.01)
*H05K 1/11* (2006.01)
*H05K 3/10* (2006.01)
*H01L 23/498* (2006.01)
*H01L 21/56* (2006.01)
*H01L 23/538* (2006.01)
*H05K 3/46* (2006.01)
*H01L 23/00* (2006.01)

(52) U.S. Cl.
CPC .................. *H05K 1/115* (2013.01); *H05K 3/10* (2013.01); *Y10T 29/49165* (2015.01); *H05K 3/4602* (2013.01); *H05K 3/4658* (2013.01); *H05K 3/4694* (2013.01); *H05K 2201/10159* (2013.01); *H05K 2201/10378* (2013.01); *H05K 2201/1053* (2013.01); *H01L 2224/16225* (2013.01); *H01L 2224/32225* (2013.01); *H01L 2224/73204* (2013.01); *H01L 2924/15311* (2013.01); *H01L 23/49816* (2013.01); *H01L 23/49894* (2013.01); *H01L 21/563* (2013.01); *H01L 23/5382* (2013.01); *H01L 23/5383* (2013.01); *H01L 23/5384* (2013.01); *H01L 24/16* (2013.01); *H01L 2224/81192* (2013.01); *H01L 2224/131* (2013.01); *H01L 2224/16227* (2013.01); *H01L 2924/15192* (2013.01)

(58) Field of Classification Search
CPC .......... H01L 2224/16225; H01L 2224/32225; H01L 2224/73204; H01L 2924/00; H01L 2224/131; H01L 2924/15311; H01L 2924/014; H01L 21/563; H01L 2224/16227; H01L 2224/81192; H01L 23/49816
USPC ........... 174/260, 261, 262; 361/760, 764, 767
See application file for complete search history.

(56) References Cited

U.S. PATENT DOCUMENTS

2009/0072384 A1* 3/2009 Wong et al. ............ 257/712
2009/0129039 A1* 5/2009 Kariya et al. ........... 361/782

(Continued)

FOREIGN PATENT DOCUMENTS

WO 2007/129545 A1 11/2007

OTHER PUBLICATIONS

U.S. Appl. No. 13/853,338, filed Mar. 29, 2013, Terui, et al.

*Primary Examiner* — Yuriy Semenenko
(74) *Attorney, Agent, or Firm* — Oblon, McClelland, Maier & Neustadt, L.L.P.

(57) ABSTRACT

A wiring board includes a first insulation layer, a second insulation layer formed on the first insulation layer, a wiring structure interposed between the first insulation layer and the second insulation layer and including an insulation layer and conductive patterns formed on the insulation layer, second conductive patterns formed on the second insulation layer, and a via conductor formed through the second insulation layer and connected to one of the second conductive patterns on the second insulation layer.

20 Claims, 25 Drawing Sheets

(56) References Cited

U.S. PATENT DOCUMENTS

| | | | |
|---|---|---|---|
| 2009/0173522 A1* | 7/2009 | Sakamoto et al. | 174/255 |
| 2011/0053318 A1* | 3/2011 | Hu | 438/113 |
| 2012/0006592 A1 | 1/2012 | Ouchi et al. | |
| 2012/0008295 A1 | 1/2012 | Ouchi et al. | |
| 2012/0151632 A1* | 6/2012 | De Maria et al. | 800/298 |

* cited by examiner

WIRING BOARD AND METHOD FOR MANUFACTURING THE SAME

CROSS-REFERENCE TO RELATED APPLICATIONS

The present application is based upon and claims the benefit of priority to Japanese Patent Application No. 2012-083288, filed Mar. 30, 2012, the entire contents of which are incorporated herein by reference.

BACKGROUND OF THE INVENTION

1. Field of the Invention

The present invention relates to a wiring board and its manufacturing method, in particular, to a wiring board having a high-density wiring region, and to a method for manufacturing such a wiring board.

2. Description of Background Art

As IC chips are becoming finer and more highly integrated, the number of pads formed on the uppermost layer of a package substrate is on the increase. In accordance with such an increase in the number of pads, the pitches of those pads are also becoming finer. To respond to such fine-pitch pads, wiring pitches of package substrates are also rapidly narrowing (for example, see International Patent Publication WO/2007/129545).

Such a wiring board has a high-density wiring region inside. Specifically, an electronic component, in which a high-density wiring layer is formed on a substrate made of a heat-tolerant base material such as silicon or glass with a low thermal expansion coefficient, is incorporated in interlayer insulation layers of a wiring board. The entire contents of this publication are incorporated herein by reference.

SUMMARY OF THE INVENTION

According to one aspect of the present invention, a wiring board includes a first insulation layer, a second insulation layer formed on the first insulation layer, a wiring structure interposed between the first insulation layer and the second insulation layer and including an insulation layer and conductive patterns formed on the insulation layer, second conductive patterns formed on the second insulation layer, and a via conductor formed through the second insulation layer and connected to one of the second conductive patterns on the second insulation layer.

According to another aspect of the present invention, a method for manufacturing a wiring board includes positioning on a first insulation layer a wiring structure including an insulation layer and conductive patterns formed on the insulation layer, forming a second insulation layer on the first insulation layer and the wiring structure such that the wiring structure is interposed between the first insulation layer and the second insulation layer, forming a via conductor through the second insulation layer, and forming second conductive patterns on the second insulation layer such that one of the second conductive patterns is connected to the via conductor in the second insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
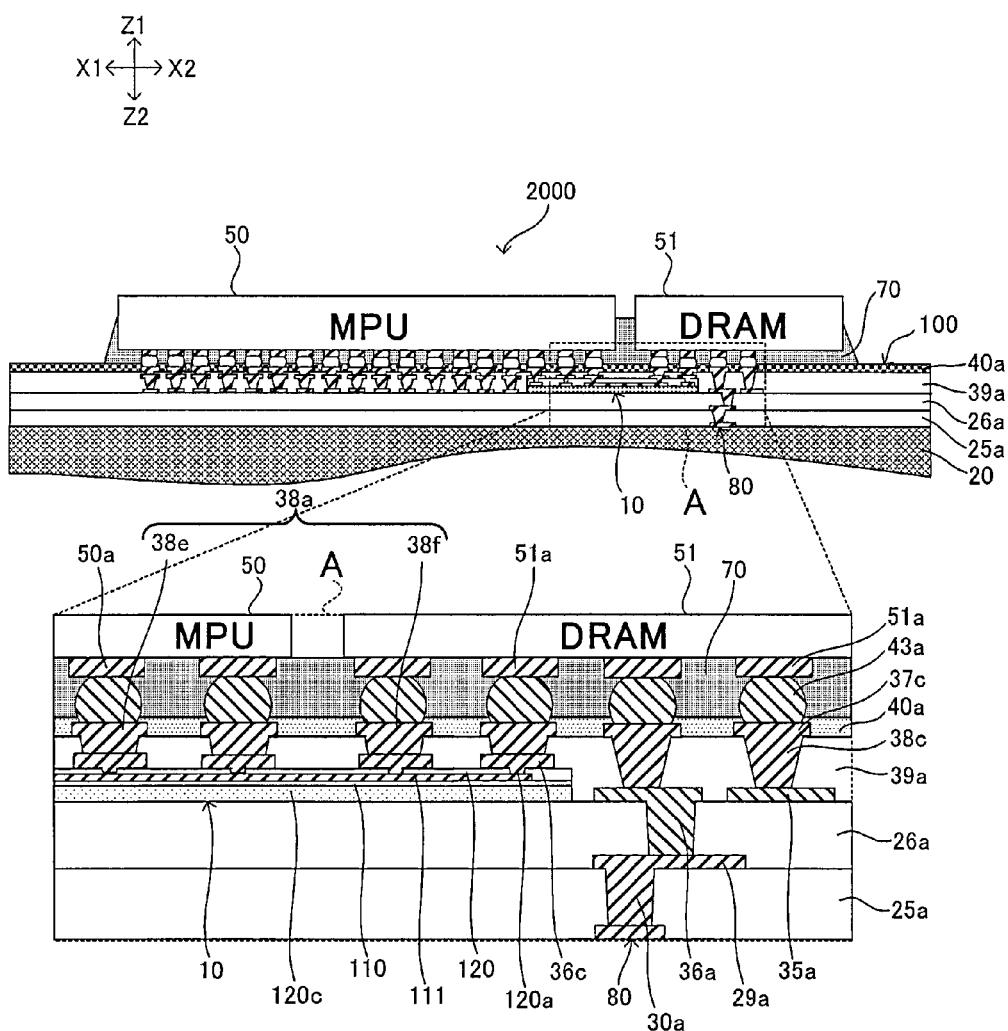
FIG. 1A is a cross-sectional view showing a package substrate using a wiring board according to a first embodiment of the present invention (the lower part is an enlarged cross-sectional view of main region (A) of the upper part)

The embodiments will now be described with reference to the accompanying drawings, wherein like reference numerals designate corresponding or identical elements throughout the various drawings.

Arrows (Z1, Z2) each indicate a lamination direction (or a thickness direction of a wiring board) corresponding to a direction along a normal line to the main surfaces (upper and lower surfaces) of the wiring board. On the other hand, arrows (X1, X2) and (Y1, Y2) each indicate a direction perpendicular to a lamination direction (or a direction toward a side of each layer). The main surfaces of a wiring board are on the X-Y plane. Side surfaces of a wiring board are on the X-Z plane or the Y-Z plane. In a lamination direction, a side closer to the core of a wiring board is referred to as a lower layer, and a side farther from the core as an upper layer.

In the embodiments below, conductive layers are such layers that include one or multiple conductive patterns. Conductive layers may include conductive patterns that form electric circuits such as wiring (ground included), pads, lands and the like, or it may include a planar conductive pattern that does not form electric circuits.

Opening portions include notches and slits in addition to holes and grooves.

Among the conductors formed in opening portions, the conductor formed in a via hole is referred to as a via conductor, the conductor formed in a through hole as a through-hole conductor, and the conductor filled in an opening portion as a filled conductor.

A land is a conductor formed on or on the periphery of a hole (via hole, through hole or the like), at least part of which is formed to be contiguous with the conductor inside the hole (via conductor, through-hole conductor or the like).

Stacking means a via conductor is formed on the land of a via conductor formed in its lower layer. Namely, unless the bottom surface of a via conductor is positioned off the land of a via conductor formed in its lower layer, they are stacked. Multiple vias stacked as such are called stacked vias.

Plating includes wet plating such as electrolytic plating and electroless plating as well as dry plating such as PVD (physical vapor deposition) and CVD (chemical vapor deposition).

As the resin material for interlayer insulation layers and a wiring structure, interlayer insulation film (brand name; ABF-45SH, made by Ajinomoto) is used as needed.

Unless otherwise specified, the "width" of a hole or a column (protrusion) indicates the diameter if it is a circle, and $2\sqrt{\text{(cross section}/\pi)}$ if it is other than a circle. However, measurements are not limited to such if they are clearly indicated otherwise. Also, when measurements are not uniform (with irregularities or tapering), basically, the average value of measurements is used (average value excluding abnormal values). However, that is not the only option when it is clearly stated that values such as the maximum value be used instead of the average value.

First Embodiment

Figure 1B:
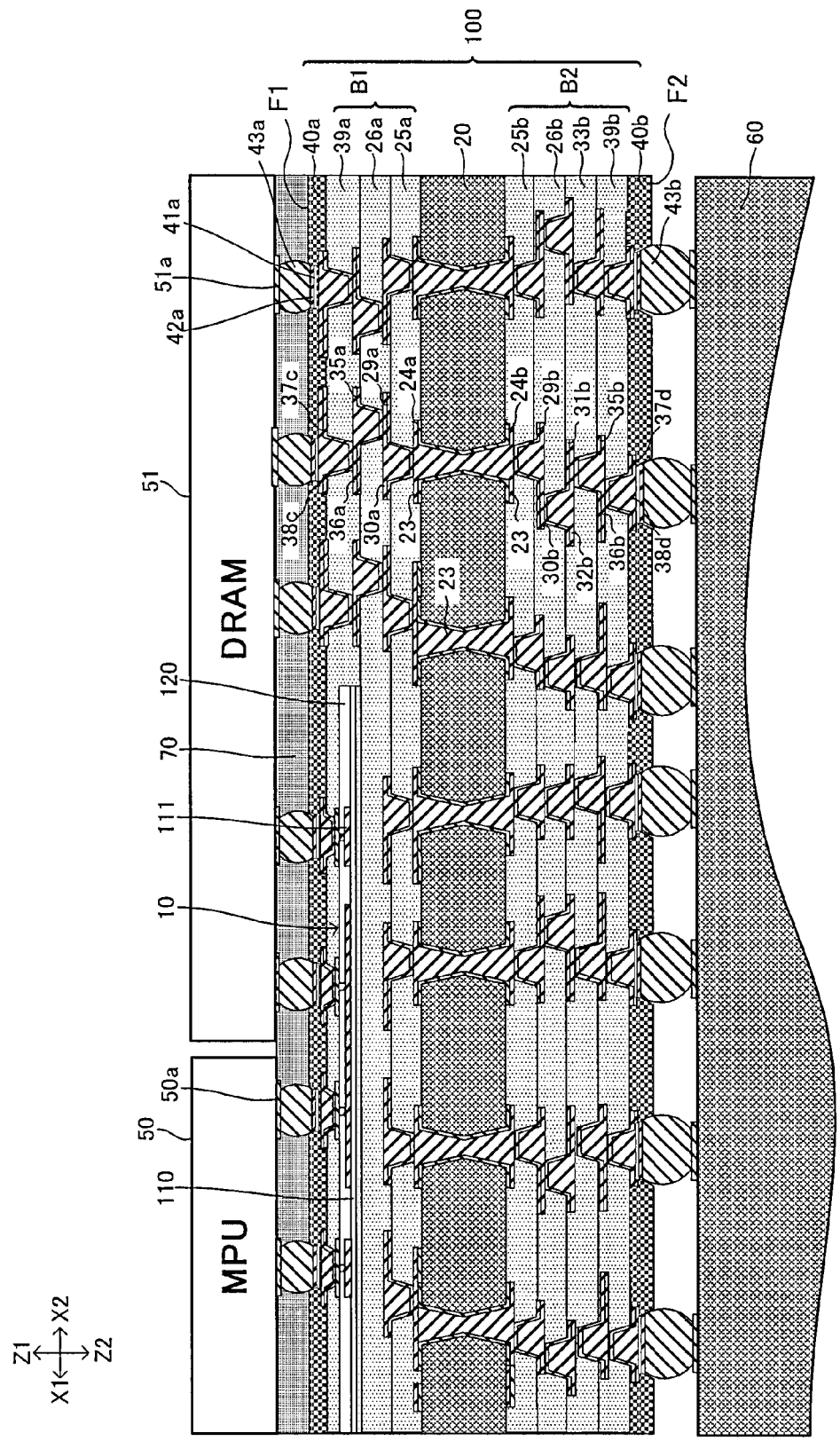
FIG. 1B is a detailed cross-sectional view showing a package substrate using a wiring board according to the first embodiment.

Wiring board 100 according to the present embodiment is a multilayer printed wiring board as shown in FIGS. 1A and 1B, for example. Wiring board 100 of the present embodiment is a buildup multilayer wiring board with a core substrate. However, that is not the only option for a wiring board of the present embodiment. For example, it may be a double-sided rigid wiring board, flexible wiring board or flex-rigid wiring board. Also, the measurements, number of layers and the like of conductive layers and insulation layers in wiring board 100 may be modified freely within a scope of the technological concept of the present invention.

Figure 2:
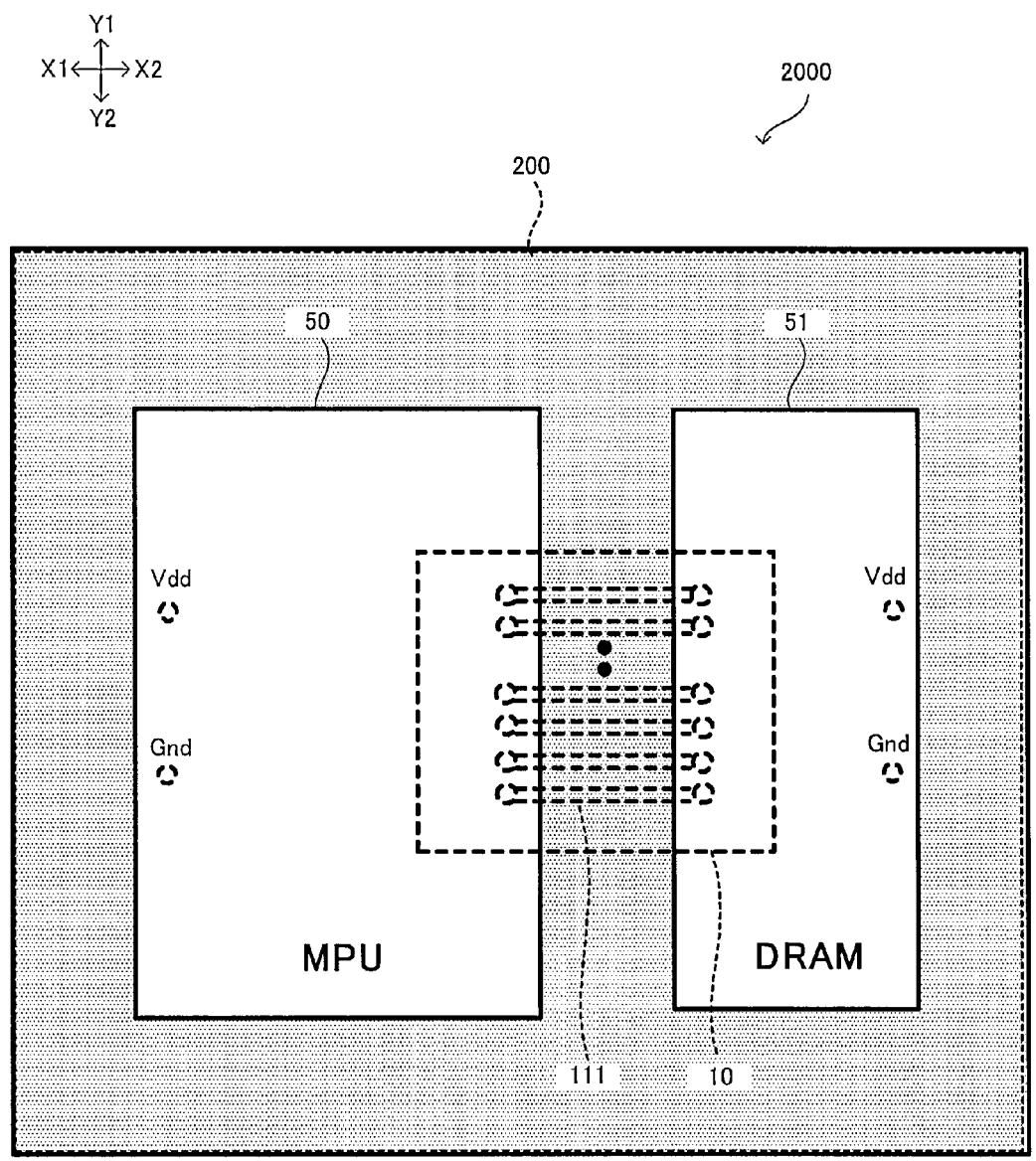
FIG. 2 is a plan view of FIG. 1A seen from direction Z2.

As shown in FIGS. 1A, 1B and 2, MPU (micro-processing unit) 50 as a first semiconductor element and DRAM (dynamic random access memory) 51 as a second semiconductor element are mounted on wiring board 100, forming package substrate 2000. As shown in FIG. 1B, wiring board 100 is mounted on motherboard 60. The space between wiring board 100 and MPU 50 and DRAM 51 is sealed with underfill resin 70.

Wiring board 100 has core substrate 20, interlayer insulation layers (25a, 26a) (first insulation layers), interlayer insulation layer (39a) (second insulation layer), interlayer insulation layers (25b, 26b, 33b, 39b), conductive layers (24a, 29a), conductive layer (35a) (first conductive pattern), conductive layer (37c) (third conductive pattern), conductive layers (24b, 29b, 31b, 35b, 37d), via conductors (23, 30a, 36a, 38c, 30b, 32b, 36b, 38d), and solder-resist layers (40a, 40b) formed on the outermost layers.

Core substrate 20 has first surface (F1) (Z1 side) and its opposing second surface (F2) (Z2 side), and via conductors 23 penetrate through core substrate 20. Core substrate 20, via conductors 23 and conductive layers (24a, 24b) correspond to the core section. Also, buildup section (B1) is formed on the first-surface (F1) side of core substrate 20, and buildup section (B2) is formed on the second-surface (F2) side of core substrate 20. Buildup section (B1) includes three pairs of interlayer insulation layers and conductive layers (interlayer insulation layers (25a, 26a, 39a) and conductive layers (24a, 29a, 35a, 37c)). Buildup section (B2) includes four pairs of interlayer insulation layers and conductive layers (interlayer insulation layers (25b, 26b, 33b, 39b) and conductive layers (24b, 29b, 31b, 35b, 37d)).

On the first-surface (F1) side of core substrate 20, four conductive layers (24a, 29a, 35a, 37c) and three interlayer insulation layers (25a, 26a, 39a) are alternately laminated from the lower side (Z2 side). Interlayer insulation layers (25a, 26a, 39a) are formed between their respective conductive layers (24a, 29a, 35a, 37c). In addition, solder-resist layer (40a) is positioned on the uppermost surface layer on the first-surface (F1) side of core substrate 20.

On the second-surface (F2) side of core substrate 20, five conductive layers (24b, 29b, 31b, 35b, 37d) and four interlayer insulation layers (25b, 26b, 33b, 39b) are alternately laminated. Interlayer insulation layers (25b, 26b, 33b, 39b) are formed between their respective conductive layers (24b, 29b, 31b, 35b, 37d). In addition, solder-resist layer (40b) is positioned on the uppermost surface layer on the second-surface (F2) side of core substrate 20.

Penetrating holes 21 that penetrate through core substrate 20 (see FIG. 7B) is formed in core substrate 20. Via conductors 23 are filled conductors, and are formed by filling penetrating holes 21 with conductors. Conductive layer (24a) formed on first surface (F1) of core substrate 20 and conductive layer (24b) formed on second surface (F2) of core substrate 20 are electrically connected to each other through via conductors 23.

Core substrate 20 is formed by impregnating core material with resin, for example. Core substrate 20 is formed by impregnating fiberglass cloth with epoxy resin, which is then thermally treated and shaped into a sheet, for example. However, that is not the only option, and any other material may be used for core substrate 20.

Via conductors 23 are shaped like an hourglass with diameters decreasing from first surface (F1) and second surface (F2) of core substrate 20 toward the center, for example. In addition, the planar shape of via conductors 23 (X-Y plane) is a perfect circle, for example. However, that is not the only option, and any other shape may be employed for via conductors 23.

In interlayer insulation layers (25a, 26a, 39a, 25b, 26b, 33b, 39b), via conductors (30a, 36a, 38c, 30b, 32b, 36b, 38d) are formed respectively. Those via conductors are each a filled conductor, and are formed by filling conductor in via holes that penetrate through their respective interlayer insulation layers. Via conductors (30a, 36a, 38c, 30b, 32b, 36b, 38d) are shaped in a tapering column (truncated cone) tapering with a diameter that decreases toward core substrate 20, for example, and their planar shape (X-Y plane) is a perfect circle, for example. However, that is not the only option, and any other shape may be employed for via conductors (30a) and the like.

Interlayer insulation layer (25a) (the lowermost interlayer insulation layer of buildup section (B1)), interlayer insulation layer (25b) (the lowermost interlayer insulation layer of buildup section (B2)), and their upper interlayer insulation layers (26a, 39a, 26b, 33b, 39b) are each made of interlayer insulation film (brand name ABF-45SH, made by Ajinomoto), for example. However, those interlayer insulation layers may also be formed using FR-4 material made by impregnating core material with resin, for example. FR-4 material is obtained by impregnating fiberglass cloth with epoxy resin, which is then thermally treated and shaped into a sheet. However, the material of each interlayer insulation layer is not limited specifically, and any other material may be used.

Solder bumps (43a) are positioned on the uppermost layer of wiring board 100. Solder bumps (43a) are electrically connected to MPU 50 and DRAM 51 through conductive pads (50a, 51a).

Wiring board 100 includes main wiring board 200 and wiring structure 10 incorporated in main wiring board 200. Wiring structure 10 is designed not according to design rules for multilayer printed wiring boards, but according to design rules for semiconductor elements such as ICs and LSIs as described later in detail. Thus, compared with main wiring board 200, wiring structure 10 is designed to have a finer L/S (line/space) ratio of line to space, which is an indicator of wiring density. Here, a line means the width of a pattern, and space is the space between patterns, which is the distance between the centers of two pattern widths. Specifically, wiring structure 10 is designed to have high-density wiring with an L/S ratio of line to space at 1 μm/1 μm or greater but 5 μm/5 μm or less, preferably 3 μm/3 μm or greater but 5 μm/5 μm or less. Such ratios are very fine compared with L/S ratios at approximately 10 μm/10 μm of regular multilayer printed wiring boards such as main wiring board 200 of the present embodiment.

Main wiring board 200 includes signal transmission lines and power lines to supply power to terminals (Vdd) of semiconductors MPU 50 and DRAM 51 (see FIG. 2).

Figure 3:
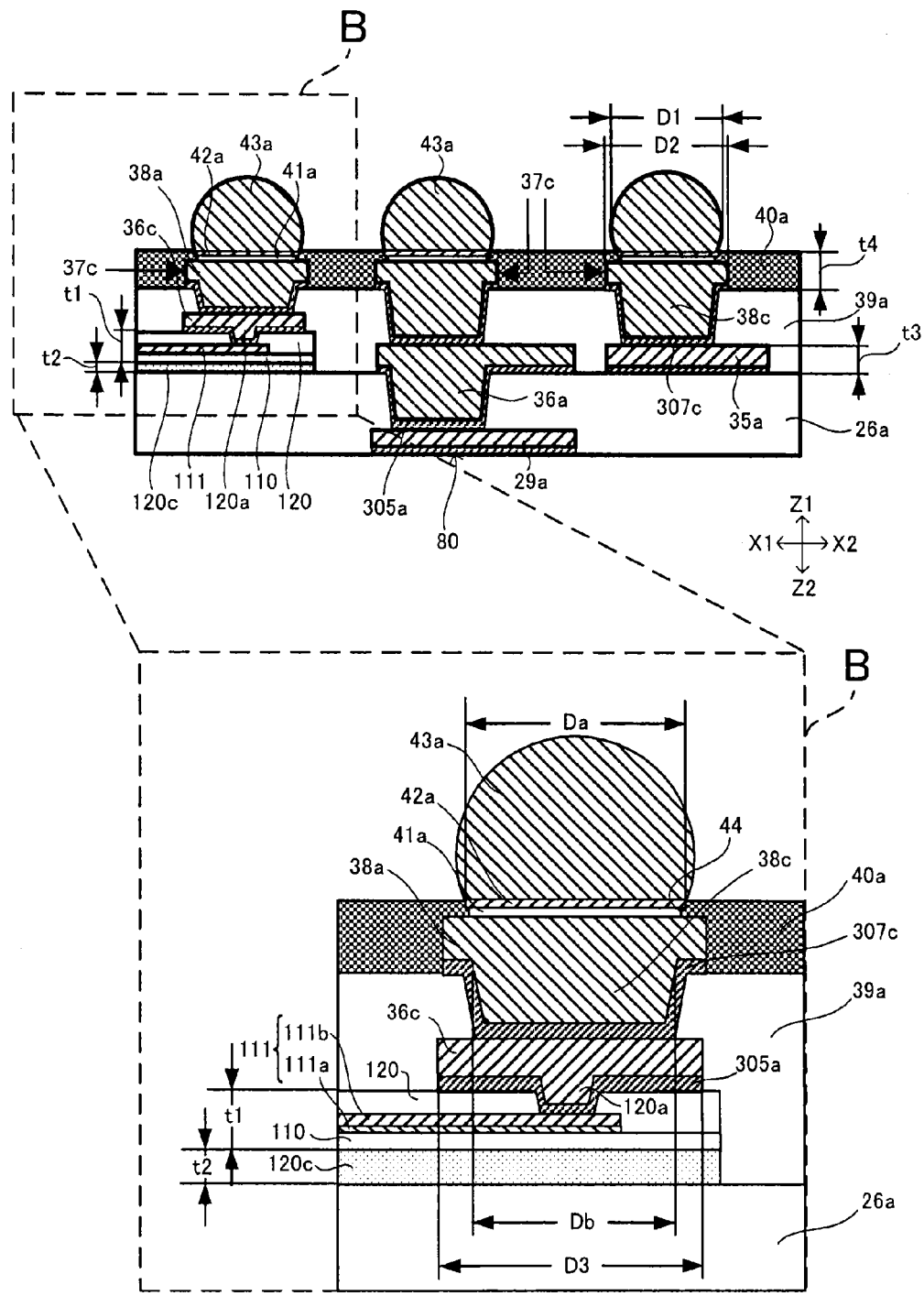
FIG. 3 is an enlarged cross-sectional view of a portion in FIGS. 1A and 1B, showing a main part of a wiring board in the first embodiment (the lower part is an enlarged cross-sectional view of main region (B) of the upper part)

Wiring structure 10 includes lowermost adhesive layer (120c), insulation layer 120 (fourth insulation layer) on adhesive layer (120c), and conductive patterns 111 (second conductive patterns) for signal transmission formed in insulation layer 120. As shown in FIG. 3, conductive patterns 111 are made up of first conductive film (111a) and second conductive film (111b). Any of polyimide, phenol resin or polybenzoxazole resin is used as the material for insulation layer 120. Also, conductive pads (36c) are formed on wiring structure 10 to be connected to conductive pads (50a) of MPU 50 and conductive pads (51a) of DRAM 51 (see FIG. 1B) through conductive pads (38a). Referring to FIG. 3, top surfaces of conductive patterns 111 of wiring structure 10 are set to be positioned on substantially the same plane as top surfaces of conductive layers (35a) of main wiring board 200. In addition, the pattern width of conductive patterns 111 of wiring structure 10 is smaller than the pattern widths of conductive layers (37c, 35a, 29a, 24a, etc.) of main wiring board 200.

As for the material for adhesive layer (120c), adhesives such as an epoxy-resin type, an acrylic-resin type and a silicone-resin type are used. Holes with fine diameters are formed in insulation layer 120. Those holes are filled with conductor to form filled via conductors (120a).

In wiring board 100 of the present embodiment, insulation layer 110 (third insulation layer) is placed between conductive patterns 111 and adhesive layer (120c). Namely, wiring structure 10 is triple-layered. However, the present embodiment is not limited to such, and it is an option for wiring structure 10 to be double-layered without including insulation layer 110 and to have conductive patterns 111 directly formed on adhesive layer (120c). Referring to FIG. 1A, among conductive pads (38a) connected to conductive patterns 111 of wiring structure 10, the distance between conductive pads (38e) (first pads) connected to MPU 50 is smaller than the distance between conductive pads (38f) (second pads) connected to DRAM 51. In addition, the distance between adjacent conductive patterns 111 is smaller than the distance between adjacent conductive layers (35a).

Wiring structure 10 does not include power-supply lines and includes only signal transmission lines, and is used to transmit signals between MPU 50 and DRAM 51.

Specifically, conductive patterns 111 are used for signal transmission between MPU 50 and DRAM 51, but are not used for power supply to MPU 50 and DRAM 51. Power terminals (Vdd) of MPU 50 and DRAM 51 are electrically connected to stacked vias 80 in main wiring board 200 (see FIG. 1A, FIG. 3) so that power is supplied from an outside DC power source. Ground terminals (Gnd) (see FIG. 3) of MPU 50 and DRAM 51 are connected to ground through other stacked vias in main wiring board 200.

In the present embodiment, wiring structure 10 is formed on interlayer insulation layer (39a) positioned as first layer from the top. However, if it is formed on interlayer insulation layer (26a) positioned as second layer from the top, for example, the effect of a small dent that may occur on the top surface of wiring board 100 is reduced by uppermost interlayer insulation layer (39a). As a result, solder bumps (43a) are formed to have a uniform height. Also, under such conditions, wiring structure 10 becomes tolerant to damage from stress, compared with when wiring structure 10 is formed on the uppermost layer.

Via conductors (120a) are electrically connected to upper-layer conductive pads (36c). In addition, conductive pads (36c) are electrically connected to MPU 50 and DRAM 51 through upper-layer conductive pads (38a), nickel-plated layer (41a), gold-plated layer (42a), solder bumps (43a) and conductive pads (50a, 51a).

The diameter of via conductors (120a) is preferred to be 1 μm or greater but 10 μm or smaller, more preferably, 0.5 μm or greater but 5 μm or smaller. By setting the diameter of via conductors (120a) at such a fine size, design freedom for wiring distribution of conductive patterns 111 increases in wiring structure 10. For example, using conductive patterns 111 formed only in single insulation layer 120, more wiring lines are distributed from either the right or left side of wiring structure 10. Besides, since conductive patterns 111 are formed only in one layer, the total number of wiring layers decreases in wiring structure 10.

As shown in FIG. 3, via conductors (36a, 38c) are formed respectively in via holes of interlayer insulation layers (26a, 39a) by means of metal layers (305a, 307c) made of metal foil such as copper foil, electroless copper-plated film and electrolytic copper-plated film.

Among the measurements of via conductors and the like shown in FIG. 3, diameter (width) (D2) on the top surface of via conductor (38c) is 62 μm, for example, and diameter (D1) of solder bump (43a) is 46 μm, for example. Also, thickness (t1) of wiring structure 10 (excluding adhesive layer (120c)) is 25 μm, for example, and thickness (t2) of adhesive layer (120c) of wiring structure 10 is 10 μm, for example, thickness (t3) of conductive layer (35a) is 15 μm, for example, and thickness (t4) of solder-resist layer (40a) is 15 μm, for example. By setting thickness (t2) of adhesive layer (120c) of wiring structure 10 at approximately 10 μm, sufficient adhesive strength is achieved with main wiring board 200, allowing a wide selection of the material for adhesive layer (120c). It is an option for thickness (t1) of wiring structure 10 and the thickness of interlayer insulation layer (39a) to be the same, or not to be strictly the same as shown in the drawing. Diameter (D3) of conductive pad (36c) on wiring structure 10 is 15 μm or greater but 25 μm or less.

Although not shown in the drawings, surfaces of conductive pad (38a) and conductive layer (37c) are coated with OSP (organic solder preservative), NiPdAu, NiAu, Sn or the like in the present embodiment. Accordingly, oxidation is prevented on the surfaces of conductive pad (38a) and conductive layer (37c) when exposed to the outside.

Referring to FIG. 3, solder bumps (43a) are positioned on via conductors (38c) in opening portions (SRO) of solder-resist layers (40a, 40b). Nickel-plated layer (41a) and gold-plated layer (42a) are formed between solder bump (43a) and via conductor (38c) (conductive layer (37c)). In the present embodiment, diameter (Da) of opening portions 44 in solder-resist layers (40a, 40b) is approximately 10% larger than diameter (Db) of the opening portions of uppermost via conductors (38c). When diameter (Da) of opening portions in solder-resist layers (40a, 40b) is greater than diameter (Db), usually the tolerances are tight during the manufacturing process. However, the diameter of via conductors (120a) is set to be fine at 1 μm or greater but 10 μm or less in wiring structure 10. Thus, even when wiring structure 10 is shifted when mounted in main wiring board 200, there is an advantage in having wide latitude to achieve secure electrical connection.

In the present embodiment, no through hole is formed in wiring board 100 to penetrate through all the layers of main wiring board 200. However, that is not the only option. By forming through holes penetrating through all the layers of main wiring board 200 and by electrically connecting conductive layers on the surface layers to each other, such through holes are used for signal transmission and power supply to a semiconductor element on wiring board 100.

In the present embodiment, via conductors (30a, 32a, 36a, 38c, 30b, 32b, 36b, 38d) formed in core substrate 20 have substantially the same size as each other. By so setting, it is easier to set uniform electrical characteristics and manufacturing conditions.

According to wiring board 100 of the present embodiment, main wiring board 200 incorporates wiring structure 10, which has higher wiring density than main wiring board 200 and is used for signal transmission between semiconductor elements. Thus, design freedom is enhanced for wiring board 100 (a multilayer printed wiring board). For example, concentration of all the power and signal wiring lines onto a specific region of a wiring board can be avoided. Also to be avoided are structures where only resin, but no conductor, exists in the region surrounding an electronic component.

The following is a description of an example of the method for manufacturing wiring board 100 according to the present embodiment. The process for manufacturing wiring board 100 is made up of the process for manufacturing wiring structure 10 and the process for manufacturing main wiring board 200, which includes steps for mounting wiring structure 10 in main wiring board 200 (multilayer printed board). Wiring structure 10 is manufactured by the process shown in FIG. 4, for example.

Process for Manufacturing Wiring Structure

Figure 4:
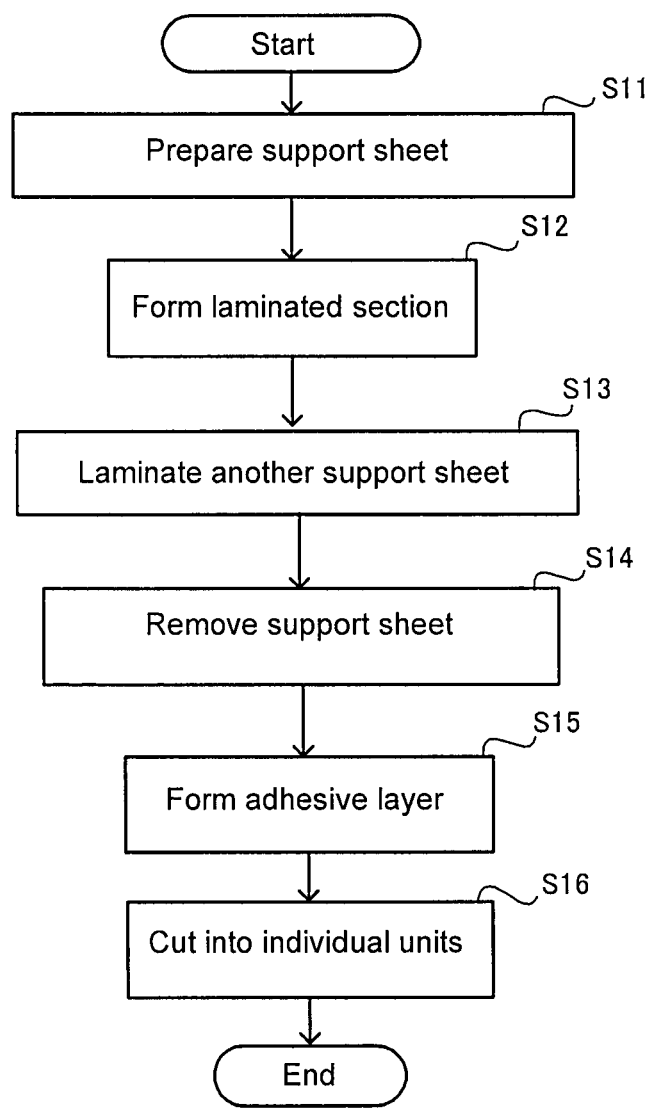
FIG. 4 is a flowchart showing the process for manufacturing a wiring structure according to the first embodiment.
Figure 5A:
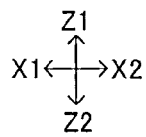
FIG. 5A is a view to illustrate a step in a method for manufacturing a wiring structure shown in FIG. 4.
Figure 5A:

Support sheet 1001 is prepared as shown in FIG. 5A in step (S11) of FIG. 4. Support sheet 1001 is glass with a flat surface, for example. Adhesive layer 1002 is formed on support sheet 1001.

In step (S12) of FIG. 4, laminated section 101 is formed on support sheet 1001 with adhesive layer 1002 in between. Laminated section 101 is formed by alternately laminating resin insulation layers and conductive patterns (conductive layers).

Figure 5B:
FIG. 5B is a view to illustrate a step in a method for manufacturing a wiring structure shown in FIG. 4.
Figure 5C:
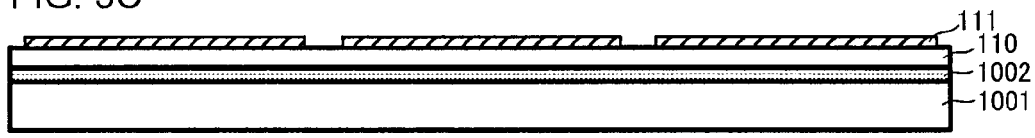
FIG. 5C is a view to illustrate a step in a method for manufacturing a wiring structure shown in FIG. 4.

Specifically, insulation layer 110 (resin insulation layer) made of resin, for example, is positioned on adhesive layer 1002 as shown in FIG. 5B. Insulation layer 110 and adhesive layer 1002 are adhered through thermal treatment, for example.

As shown in FIG. 5B, conductive patterns 111 are formed on insulation layer 110 using a semi-additive (SAP) method, for example. First conductive film (111a) (see FIG. 3) of conductive patterns 111 is triple-layered with a TiN layer (lower layer), a Ti layer (middle layer) and a Cu layer (upper layer). Since those metal layers are each formed by sputtering, for example, excellent adhesiveness is secured between fine conductive patterns 111 and base material (insulation layer 110). Also, second conductive film (111b) of conductive patterns 111 is made of electroless copper-plated film on the Cu layer and electrolytic plated film on the electroless copper-plated film.

Conductive patterns 111 are formed to be high density with an L/S (line/space) ratio of line to space at 1 μm/1 μm or greater but 5 μm/5 μm or less, preferably 3 μm/3 μm or greater but 5 μm/5 μm or less. A line means a pattern width, and space is the space between patterns, which is the distance between the centers of two pattern widths. Here, wiring is set to be high density using the same design rules as those for forming semiconductor elements such as ICs (integrated circuits) or LSIs (large scale integrated circuits).

Figure 5D:
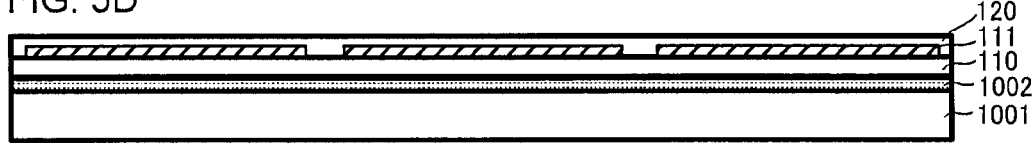
FIG. 5D is a view to illustrate a step in a method for manufacturing a wiring structure shown in FIG. 4.

As shown in FIG. 5D, insulation layer 120 is formed on insulation layer 110 by lamination, for example. Insulation layer 120 is formed to cover conductive patterns 111.

Using a laser, for example, holes (via holes) are formed in insulation layer 120. Holes are formed to reach and expose portions of conductive patterns 111. The diameter of the holes is set to be a fine size of 1 μm or greater but 10 μm or smaller, more preferably 0.5 μm or greater but 5 μm or smaller. Then, desmearing and soft etching are conducted as needed.

Using a semi-additive (SAP) method, for example, via conductors (120a) (filled conductors) are formed in the holes, while conductive pads (36c) are formed on insulation layer 120 to be connected to via conductors (120a).

Figure 5E:
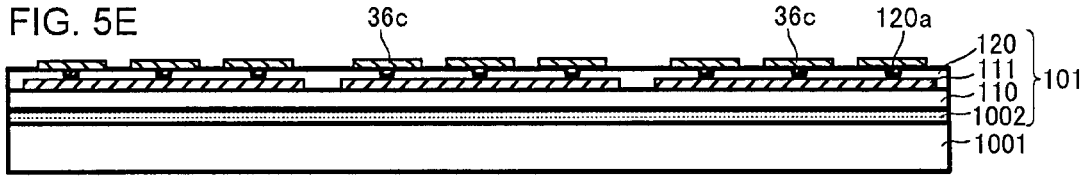
FIG. 5E is a view to illustrate a step in a method for manufacturing a wiring structure shown in FIG. 4.

Accordingly, as shown in FIG. 5E, laminated section 101, which is made up of insulation layers (110, 120) and conductive patterns 111, is formed on support sheet 1001. Via conductors (120a) are formed in insulation layer 120 of laminated section 101. Conductive pads (36c) are formed on insulation layer 120 to be connected to via conductors (120a).

Figure 5F:
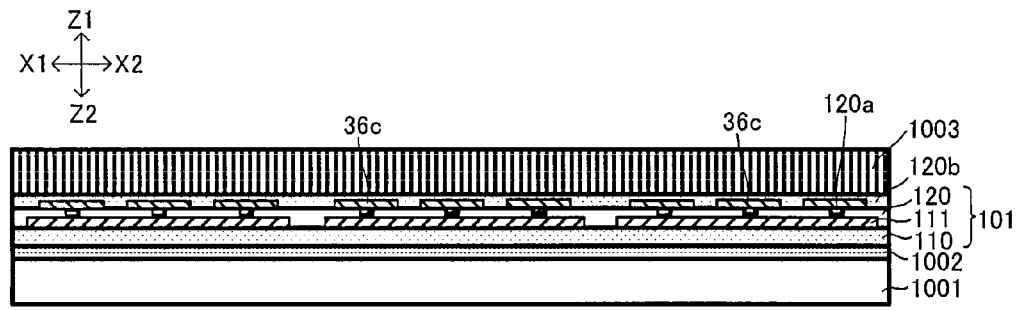
FIG. 5F is a view to illustrate a step in a method for manufacturing a wiring structure shown in FIG. 4.

In step (S13) of FIG. 4, another support sheet 1003 is prepared, as shown in FIG. 5F. The same as support sheet 1001, support sheet 1003 is made of glass with a flat surface, for example. Then, support sheet 1003 is laminated on laminated section 101 with adhesive layer (120b) in between.

Figure 5G:
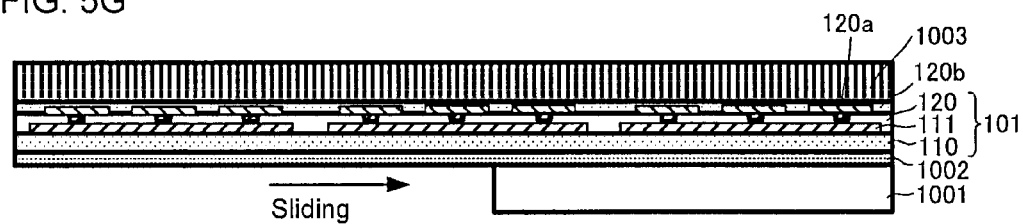
FIG. 5G is a view to illustrate a step in a method for manufacturing a wiring structure shown in FIG. 4.
Figure 5H:
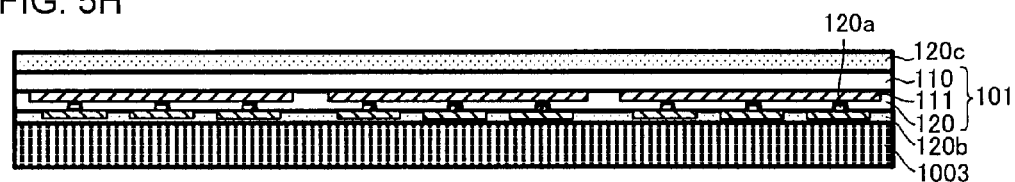
FIG. 5H is a view to illustrate a step in a method for manufacturing a wiring structure shown in FIG. 4.

In step (S14) of FIG. 4, support sheet 1001 is removed. Specifically, for example, after adhesive layer 1002 is softened by irradiating a laser, by sliding support sheet 1001 in direction X (or direction Y), as shown in FIG. 5G, support sheet 1001 is removed from a second main surface of laminated section 101. If adhesive layer 1002 remains on the second surface of laminated section 101 after support sheet 1001 has been removed from laminated section 101, such adhesive layer 1002 is removed by cleansing. In doing so, laminated section 101 is formed on support sheet 1003 as shown in FIG. 5H. Support sheet 1001 may be used again by cleaning it, for example.

In step (S15) of FIG. 4, adhesive layer (120c) is formed on laminated section 101 using an adhesive such as an epoxy-resin type, an acrylic-resin type, a silicone-resin type or the like. Specifically, adhesive layer (120c) is formed on laminated section 101 by laminating an adhesive using a laminator to make uniform thickness.

Figure 5I:
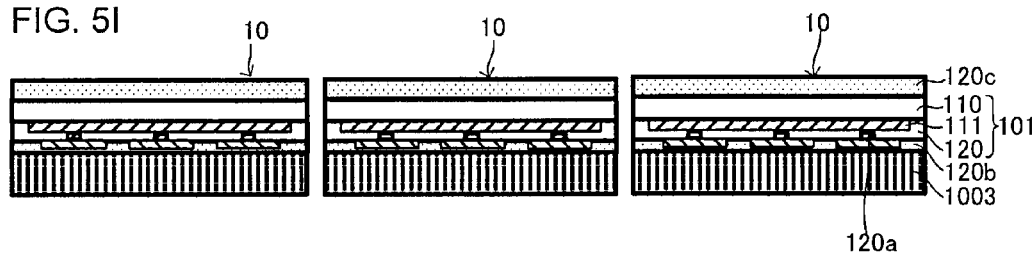
FIG. 5I is a view to illustrate a step in a method for manufacturing a wiring structure shown in FIG. 4.

In step (S16) of FIG. 4, using a dicing saw, for example, individual units are obtained by cutting along predetermined dicing lines as shown in FIG. 5I. Accordingly, multiple wiring structures 10 are obtained. In wiring structure 10 at this stage, laminated section 101 is formed on support sheet 1003 with adhesive layer (120b) placed in between, and adhesive layer (120c) is further formed on laminated section 101.

In the method for manufacturing wiring structure 10 of the present embodiment, since a glass sheet with a flat surface is used for support sheets (1001, 1003), wiring board 100 is made with high quality having flat surfaces and suppressed warping.

Main wiring board 200 is manufactured, while wiring structure 10 is mounted in main wiring board 200 to obtain wiring board 100 of the present embodiment. Wiring board 100 is manufactured by a process shown in FIG. 6, for example.

Process for Manufacturing Wiring Board

Figure 6:
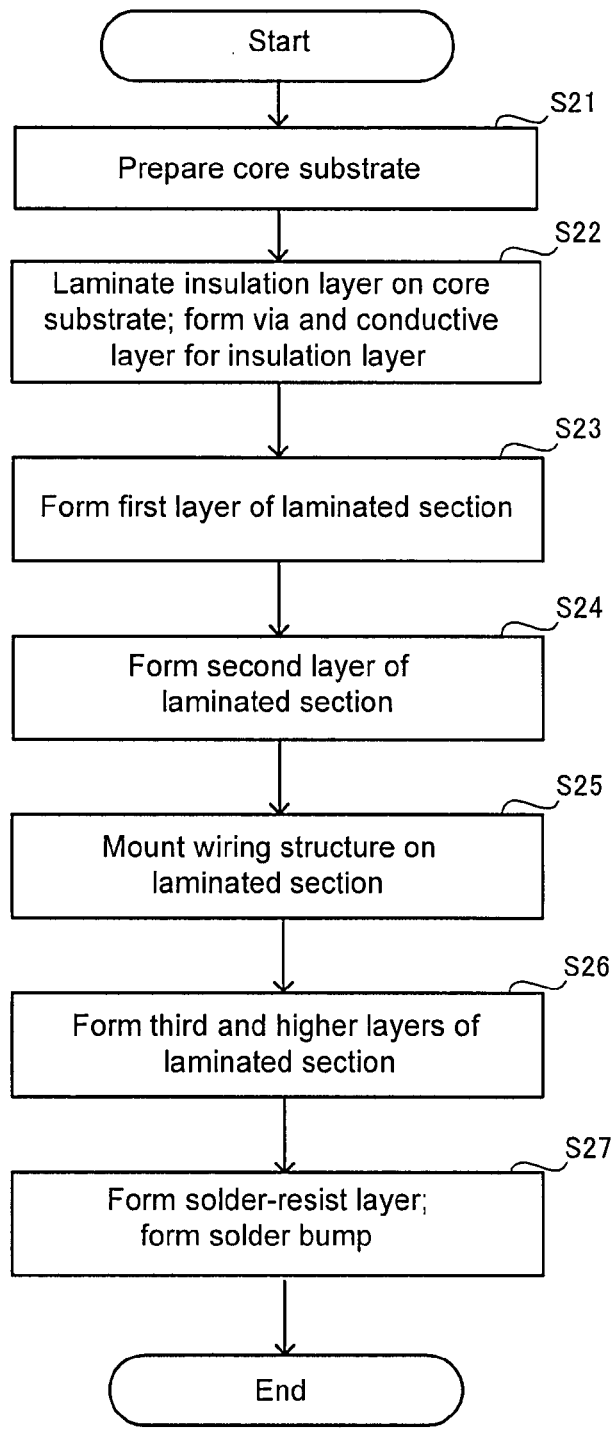
FIG. 6 is a flowchart showing the process for manufacturing a wiring board according to the first embodiment.
Figure 7A:
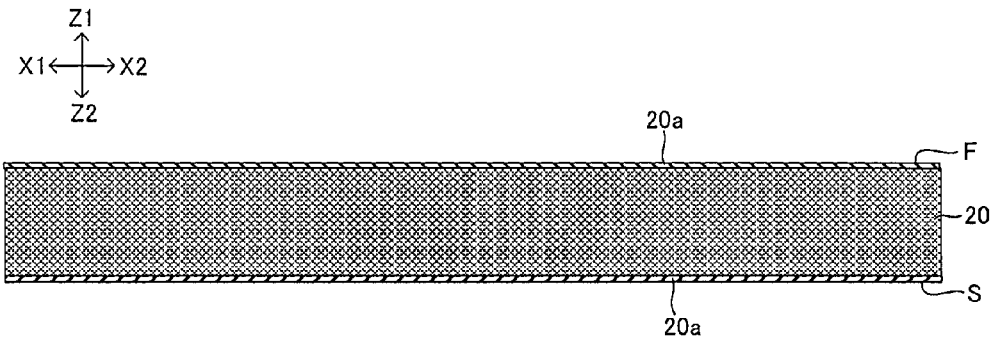
FIG. 7A is a view to illustrate a step in a method for manufacturing a wiring board shown in FIG. 6.

First, in step (S21) of FIG. 6, core substrate 20 made by impregnating reinforcing material with resin is prepared as shown in FIG. 7A. Copper foil (20a) is laminated on first surface (F) and second surface (S) of core substrate 20. The thickness of core substrate 20 is 0.4 mm or greater but 0.7 mm or less, for example. As for reinforcing material, glass cloth, aramid fabric, glass fabric or the like is used, for example. As for resin, epoxy resin, BT (bismaleimide triazine) resin or the like is used, for example. Moreover, hydroxide particles are contained in resin. As for hydroxide, metal hydroxides such as aluminum hydroxide, magnesium hydroxide, calcium hydroxide, barium hydroxide and the like are listed. Since hydroxide decomposes on heating to produce water, it is thought that hydroxide robs heat from the material to form a core substrate. Namely, when the core substrate contains hydroxide, it is thought that laser processing results improve.

A solution containing NaOH (10 g/L), $NaClO_2$ (40 g/L) and $Na_3PO_4$ (6 g/L) is applied on the surface of copper foil (20a) to conduct a black-oxide treatment by blackening bath (oxidation bath).

Figure 7B:
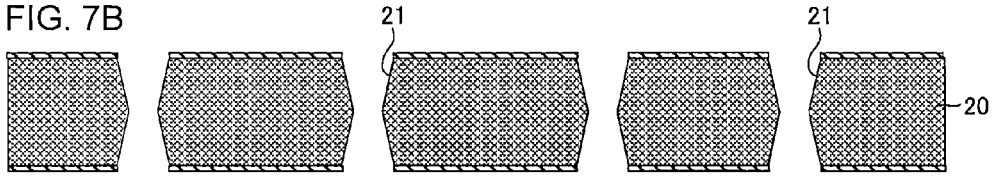
FIG. 7B is a view to illustrate a step in a method for manufacturing a wiring board shown in FIG. 6.

In step (S22) of FIG. 6, a $CO_2$ laser is used to irradiate a laser from the first-surface (F) (upper-surface) side and the second-surface (S) (lower-surface) side of core substrate 20 to form penetrating holes 21 that penetrate through core substrate 20, as shown in FIG. 7B. Specifically, by irradiating a $CO_2$ laser alternately from the first-surface (F) side and the second-surface (S) side of core substrate 20, holes bored from the first-surface (F) side and the second-surface (S) side are joined together to form penetrating hole 21.

Desmearing is conducted on core substrate 20 by immersing it in a solution containing permanganic acid at a predetermined concentration. At that time, core substrate 20 is preferred to be treated so that the percentage of its weight loss is 1.0 wt. % or lower, preferably 0.5 wt. % or lower. Since core substrate 20 is formed by impregnating reinforcing material such as glass cloth with resin, glass cloth may protrude into penetrating holes when resin is dissolved during the desmearing treatment. However, if the percentage of weight loss of core substrate 20 is in such a range, protrusion of glass cloth is suppressed, thus preventing voids when plating is filled in penetrating holes. Then, a palladium catalyst is attached on the surfaces of core substrate 20.

Figure 7C:
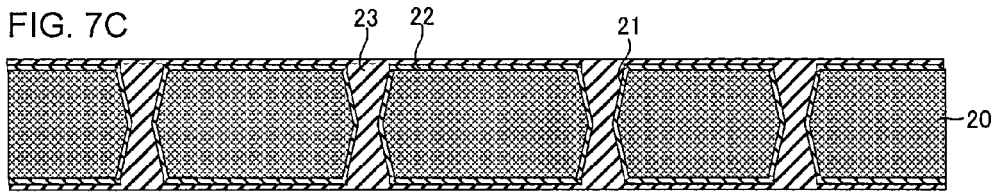
FIG. 7C is a view to illustrate a step in a method for manufacturing a wiring board shown in FIG. 6.

Core substrate 20 is immersed in an electroless plating solution to form electroless plated film 22 on first surface (F) and second surface (S) of core substrate 20 and on the inner walls of penetrating holes 21 as shown in FIG. 7C. As for the material for electroless plated film 22, copper, nickel and the like are listed. Electrolytic plated film is formed on electroless plated film 22 using electroless plated film 22 as a seed layer. Accordingly, penetrating holes 21 are filled with electrolytic plated film to form via conductors 23.

Figure 7D:
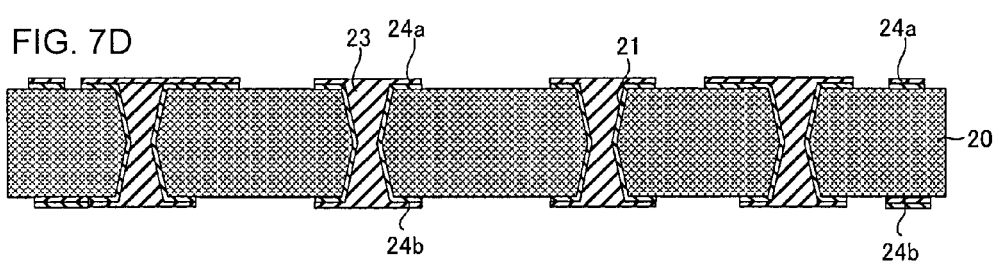
FIG. 7D is a view to illustrate a step in a method for manufacturing a wiring board shown in FIG. 6.

Etching resist with a predetermined pattern is formed on electrolytic plated film on substrate surfaces, and electroless plated film 22, electrolytic plated film and copper foil are removed from where no etching resist is formed, as shown in FIG. 7D. Then, etching resist is removed. Accordingly, conductive layers (24a) are formed on first surface (F) of core substrate 20, and conductive layers (24b) are formed on second surface (S) of core substrate 20. Conductive layers (24a) and conductive layers (24b) are electrically connected to each other by via conductors 23 made of electrolytic plated film in penetrating holes 21.

Figure 7E:
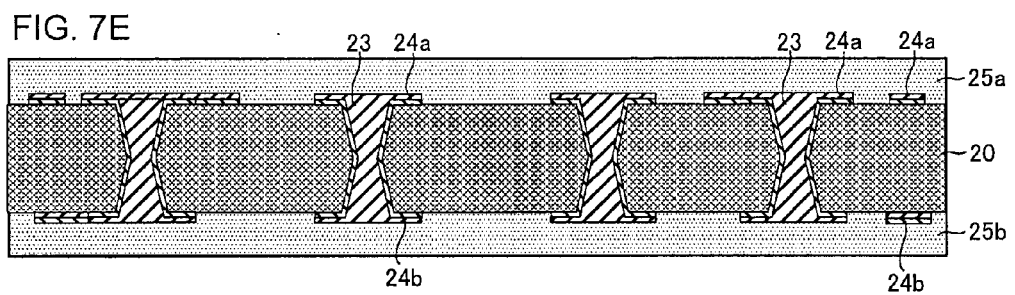
FIG. 7E is a view to illustrate a step in a method for manufacturing a wiring board shown in FIG. 6.

In step (S23) of FIG. 6, interlayer insulation film (brand name ABF-45SH, made by Ajinomoto), for example, is laminated on both surfaces (F, S) of core substrate 20 to form interlayer insulation layers (25a, 25b) as shown in FIG. 7E.

Figure 7F:
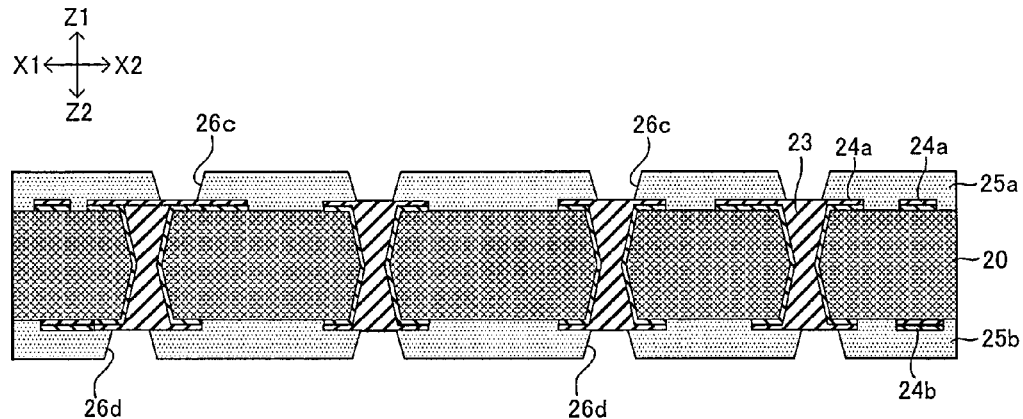
FIG. 7F is a view to illustrate a step in a method for manufacturing a wiring board shown in FIG. 6.

Using a $CO_2$ gas laser, via-hole opening portions (26c, 26d) are formed respectively in interlayer insulation layers (25a, 25b) as shown in FIG. 7F. Then, the substrate is immersed in an oxidant such as permanganate to conduct a desmearing treatment.

Figure 7G:
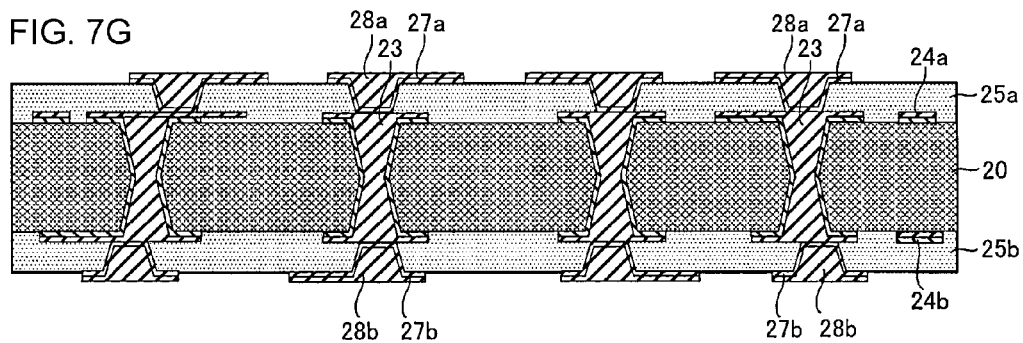
FIG. 7G is a view to illustrate a step in a method for manufacturing a wiring board shown in FIG. 6.
Figure 7H:
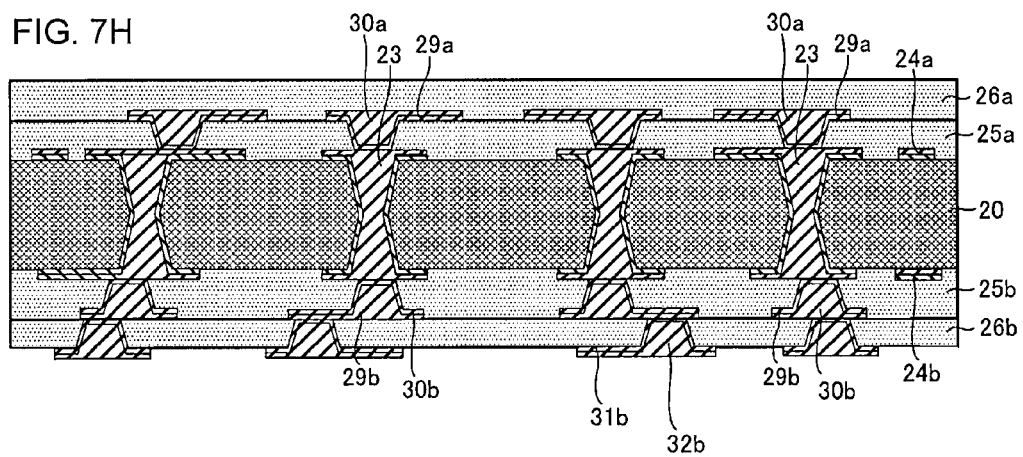
FIG. 7H is a view to illustrate a step in a method for manufacturing a wiring board shown in FIG. 6.

A palladium catalyst or the like is attached to surfaces of interlayer insulation layers (25a, 25b) and the substrate is immersed in an electroless plating solution to form electroless plated films (27a, 27b) as shown in FIG. 7G. Then, plating resist (not shown) is formed on electroless plated films (27a, 27b). Electrolytic plated films (28a, 28b) are formed on portions of electroless plated films (27a, 27b) exposed from the plating resist. After that, plating resist is removed using a solution containing monoethanolamine. By etching away electroless plated films between portions of electrolytic plated films, conductive layers (29a, 29b) and via conductors (30a, 30b) are formed as shown in FIG. 7H. Then, Sn plating is performed on surfaces of conductive layers (29a, 29b) to form SnCu layers. A silane coupling agent is applied on the SnCu layers.

Figure 7I:
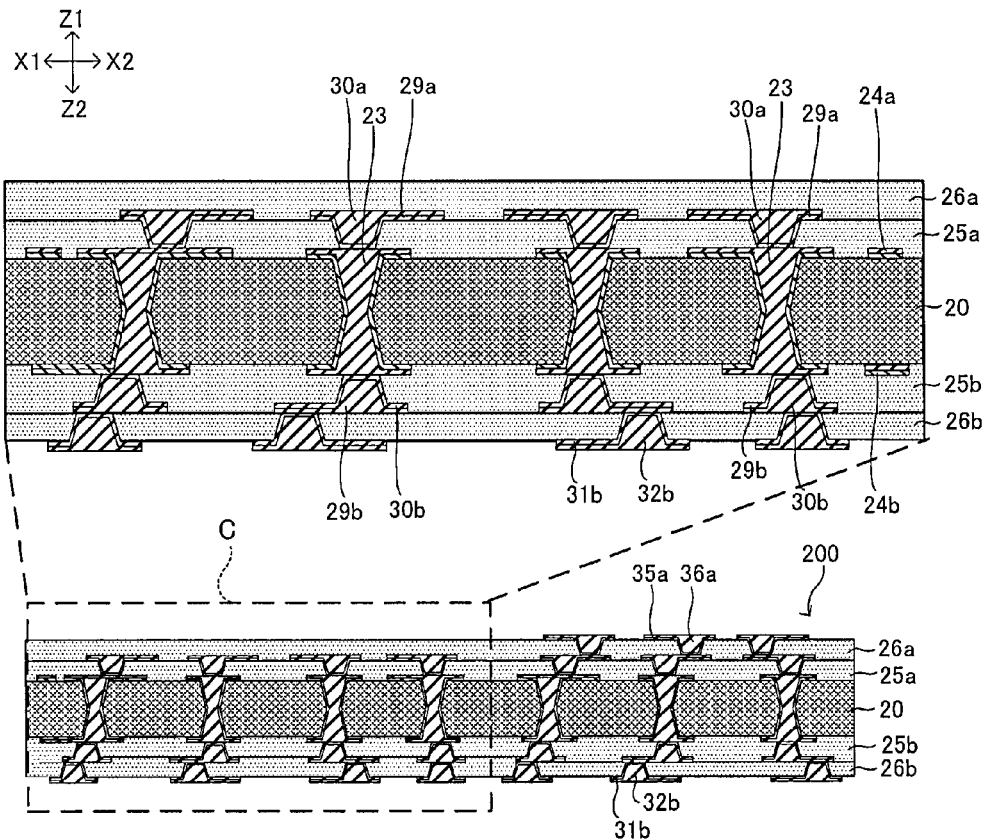
FIG. 7I is a view to illustrate a step in a method for manufacturing a wiring board shown in FIG. 6 (the lower part is an enlarged cross-sectional view of main region (C) of the upper part)
Figure 7J:
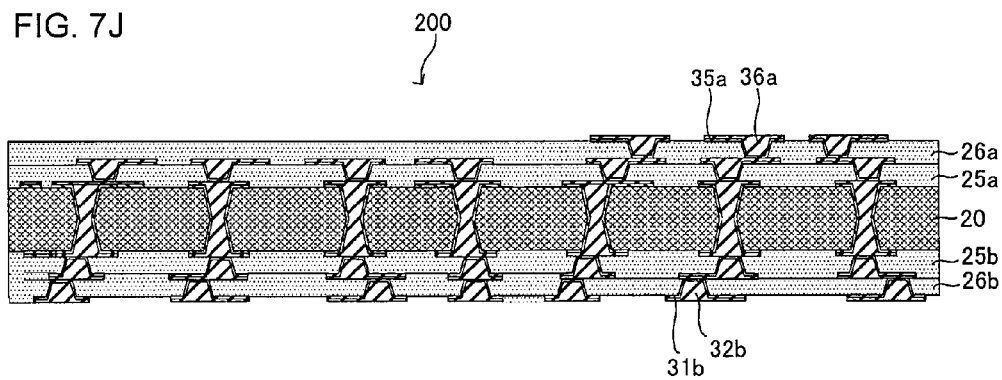
FIG. 7J is a view to illustrate a step in a method for manufacturing a wiring board shown in FIG. 6.

In step (S24) of FIG. 6, the above-described steps are repeated as shown in FIG. 7I. Accordingly, from the first-surface (F) side and second-surface (S) side of core substrate 20, interlayer insulation layers (26a, 26b) are laminated on interlayer insulation layers (25a, 25b), and then conductive layers (35a, 31b) and via conductors (36a, 32b) are formed on interlayer insulation layers (26a, 26b) as shown in FIG. 7J.

Figure 7K:
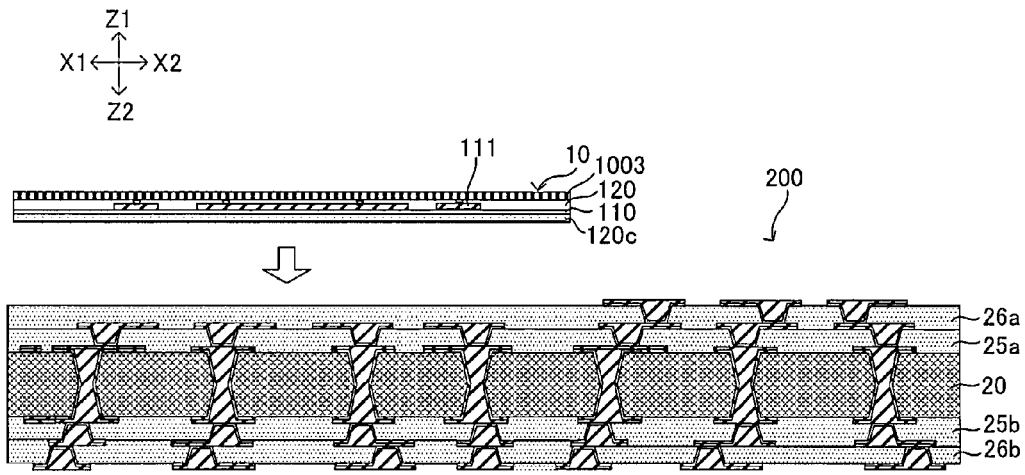
FIG. 7K is a view to illustrate a step in a method for manufacturing a wiring board shown in FIG. 6.
Figure 7L:
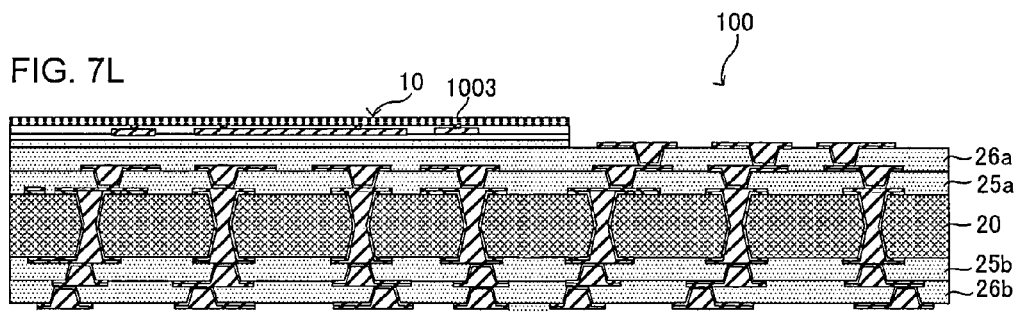
FIG. 7L is a view to illustrate a step in a method for manufacturing a wiring board shown in FIG. 6.

In step (S25) of FIG. 6, wiring structure 10 is mounted on a predetermined region on interlayer insulation layer (26a) with adhesive layer (120c) placed in between as shown in FIG. 7K, thus achieving the state shown in FIG. 7L.

Figure 7M:
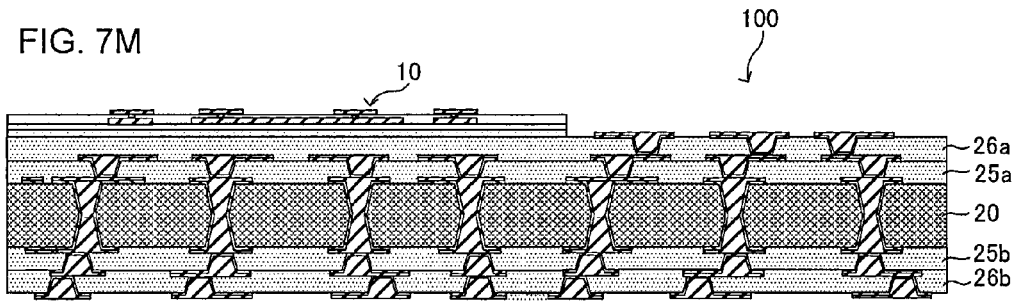
FIG. 7M is a view to illustrate a step in a method for manufacturing a wiring board shown in FIG. 6.

Support sheet 1003 is removed as shown in FIG. 7M, and then adhesive layer (120b) is removed.

Figure 7N:
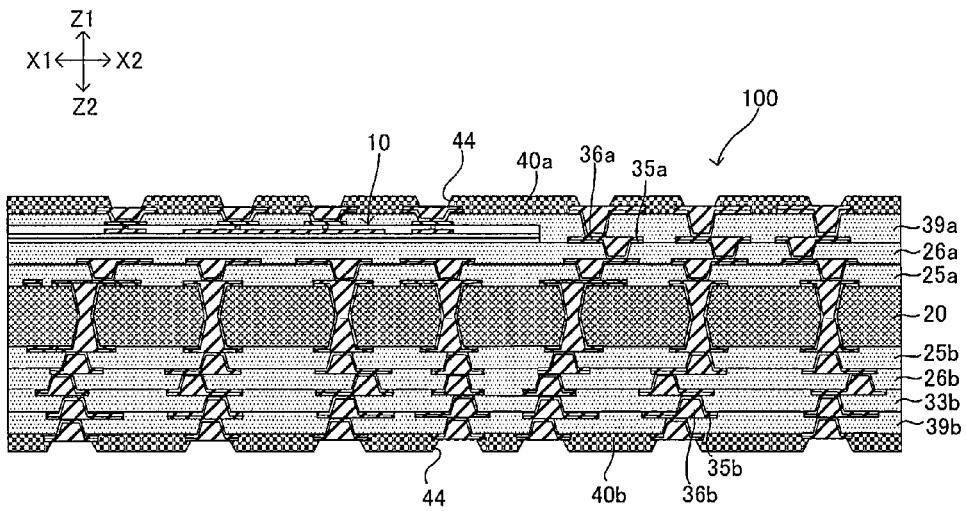
FIG. 7N is a view to illustrate a step in a method for manufacturing a wiring board shown in FIG. 6.

In step (S26) of FIG. 6, interlayer insulation layer (33b) is laminated on interlayer insulation layer (26b), and interlayer insulation layer (39a, 39b) are laminated respectively on wiring structure 10 and interlayer insulation layer (33b) as shown in FIG. 7N. The above-described steps are further repeated. Accordingly, from the first-surface (F) side and second-surface (S) side of core substrate 20, interlayer insulation layer (39a) and interlayer insulation layers (33b, 39b) are laminated on interlayer insulation layers (26a, 26b) respectively, and conductive layers (37c) (third conductive patterns) and via conductors (38c) are formed on interlayer insulation layer (39a). Moreover, conductive layers (35b, 37d) and via conductors (36b, 38d) are formed on interlayer insulation layers (33b, 39b). After that, solder-resist layers (40a, 40b) with opening portions 44 are formed by photolithography on both surfaces of the substrate. Upper surfaces of conductive layers (37c, 37d) and via conductors (38c, 38d) exposed from opening portions 44 work as solder pads (mounting pads).

Figure 7P:
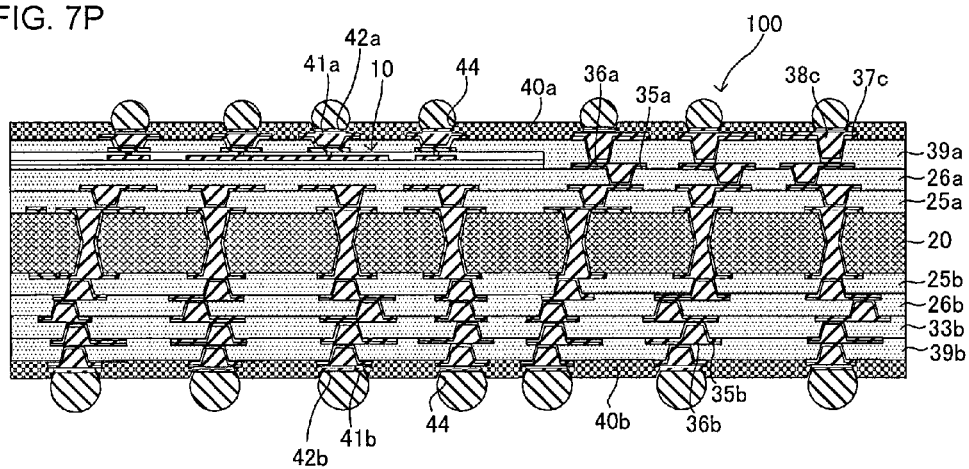
FIG. 7P is a view to illustrate a step in a method for manufacturing a wiring board shown in FIG. 6.

In step (S27) of FIG. 6, nickel-plated layers (41a, 41b) are formed on solder pads, and gold-plated layers (42a, 42b) are further formed on nickel-plated layers (41a, 41b) as shown in FIG. 7P. Instead of nickel-gold layers, nickel-palladium-gold layers may also be formed. Moreover, thin film made of OSP (organic solder preservative), NiPdAu, NiAu, Sn or the like is formed to cover conductive pads (38a) and mounting pads for conductive layers (37c) exposed to the outside from opening portions 44 on the upper surface of wiring board 100. Then, solder balls are loaded in opening portions 44 and a reflow is conducted to form solder bumps (43a) on the first-surface (upper-surface) side and solder bumps (43b) on the second-surface (lower-surface) side. Accordingly, wiring board 100 of the present embodiment is completed as a multilayer printed wiring board.

The method for manufacturing wiring board 100 of the present embodiment is not limited to the above embodiment, and may be modified within a scope that does not deviate from the technological concept of the present invention. Modified examples of the present embodiment are described below.

Modified Example 1

Figure 8:
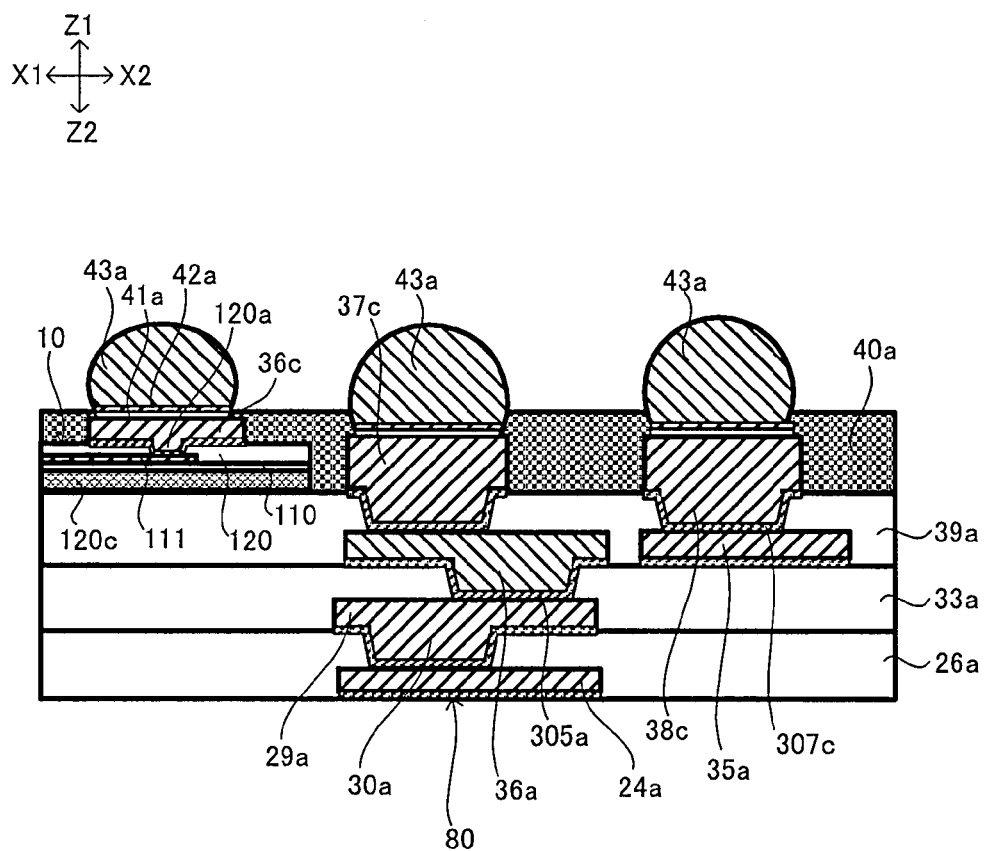
FIG. 8 is a cross-sectional view showing a main part of a wiring board according to a first modified example of the first embodiment.

In the above embodiment, wiring structure 10 is formed in the interlayer insulation layer positioned as first layer from the top. However, that is not the only option, and wiring structure 10 may be formed on interlayer insulation layer (39a) as shown in FIG. 8. In such a case, wiring structure 10 is covered with solder-resist layer (40a). Also, conductive pads (36c) work as mounting pads to mount a semiconductor chip. Except for such modifications, the rest of the structure and measurements of each element are the same as in the above embodiment. Also, regarding the process for manufacturing wiring board 100, it is the same as the above embodiment, except that wiring structure 10 is formed on interlayer insulation layer (39a) positioned as first layer from the top and is covered by solder-resist layer (40a).

Modified Example 2

In the above Modified Example 1, via conductor (120a) of wiring structure 10 is connected to solder bump (43a) through conductive pad (36c) as shown in FIG. 8. However, that is not the only option, and via conductor (120a) of wiring structure 10 may also be connected to solder bump (43a) through under-bump metal (UBM) substituted for conductive pad (36c). Except for such a modification, the rest of the structure and measurements of each element are the same as in the above Modified Example 1. Also, regarding the process for manufacturing wiring board 100, it is the same as the above embodiment, except that via conductor (120a) of wiring structure 10 is connected to solder bump (43a) through under-bump metal (UBM).

Second Embodiment

Figure 9A:
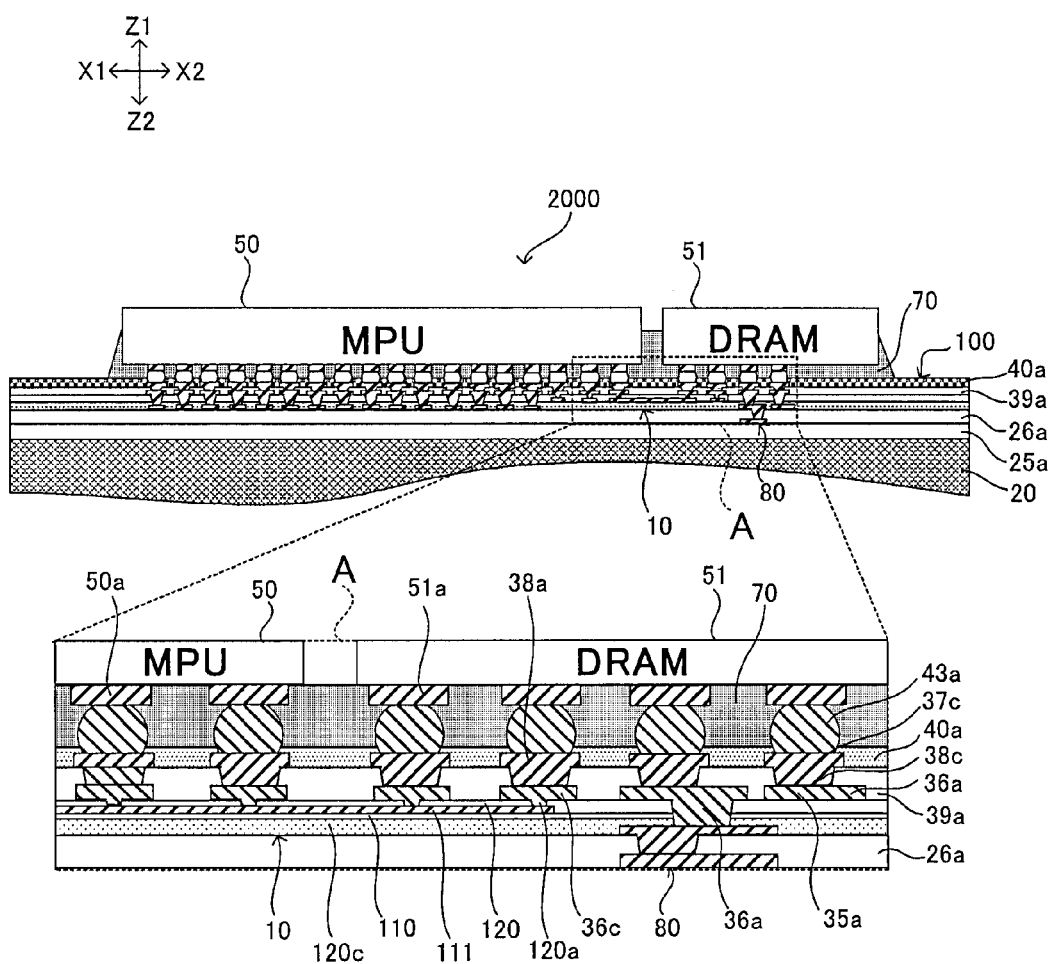
FIG. 9A is a cross-sectional view showing a package substrate using a wiring board according to a second embodiment of the present invention (the lower part is an enlarged cross-sectional view of main region (A) of the upper part)
Figure 9B:
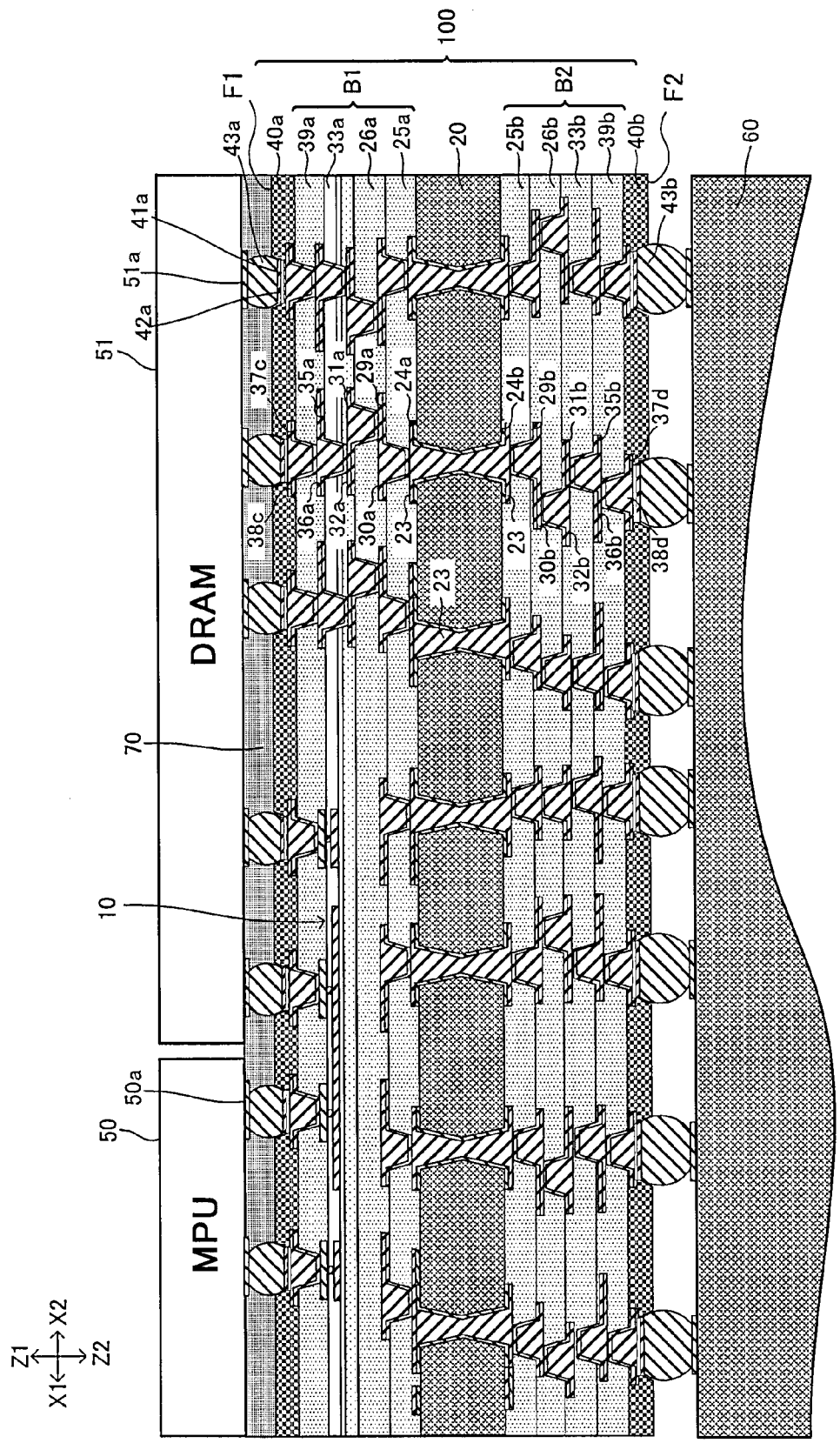
FIG. 9B is a detailed cross-sectional view showing a package substrate using a wiring board according to the second embodiment.
Figure 10:
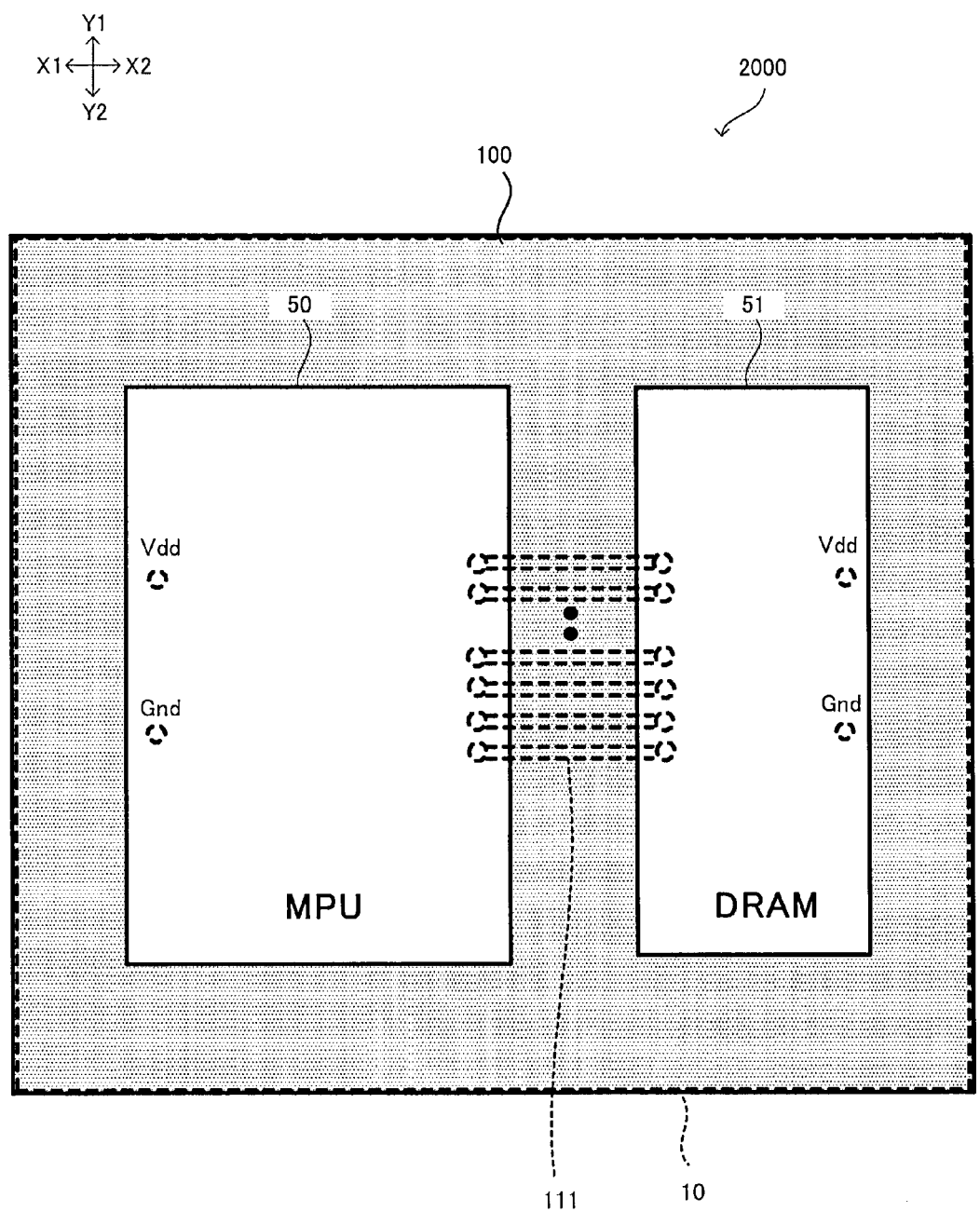
FIG. 10 is a plan view of FIG. 9A seen from direction Z2.

In the above first embodiment, wiring structure 10 was formed in one region on interlayer insulation layer (26a) as shown in FIGS. 1A, 1B and 2. By contrast, in the second embodiment, wiring structure 10 may also be formed in the entire region of interlayer insulation layer (26a) as shown in FIGS. 9A, 9B and 10. In such a case, interlayer insulation layer (26a) of main wiring board 200 of the first embodiment is entirely covered by wiring structure 10.

Figure 11:
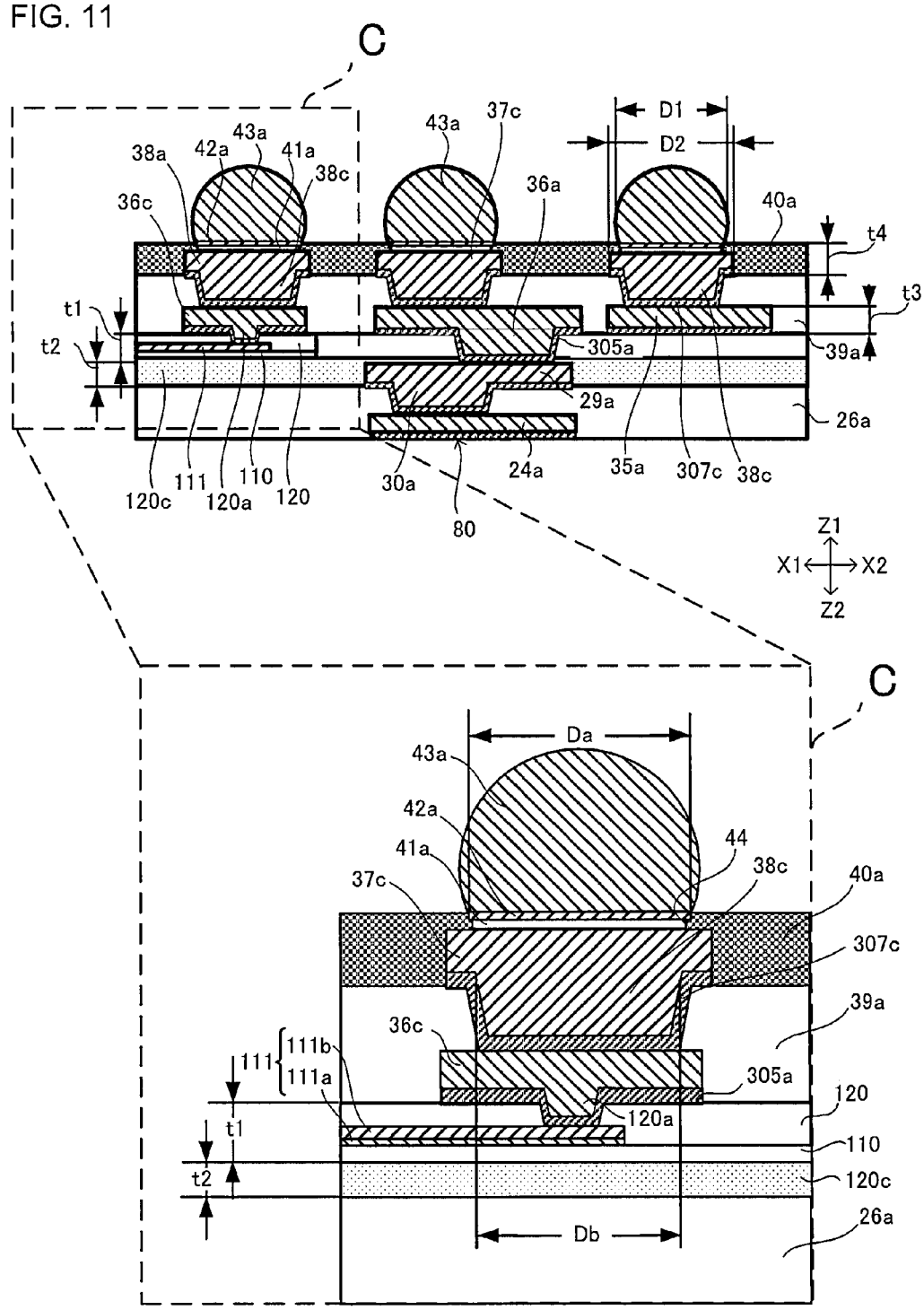
FIG. 11 is an enlarged cross-sectional view of a portion in FIGS. 9A and 9B, showing a main part of a wiring board in the second embodiment (the lower part is an enlarged cross-sectional view of main region (C) of the upper part)

In the second embodiment as well, only signal transmission lines exist in wiring structure 10, and no power supply line is present. As shown in FIGS. 9A and 11, power is supplied to MPU 50 and DRAM 51 through stacked vias 80 formed in main wiring board 200. In the present embodiment, stacked vias 80 are formed so as to penetrate through wiring structure 10.

In the present embodiment, the rest of the structure and measurements of each element are the same as in the first embodiment.

An example of the method for manufacturing wiring board 100 of the present embodiment is described below. The same as in the first embodiment, the process for manufacturing wiring board 100 is made up of the process for manufacturing wiring structure 10 and the process for manufacturing main wiring board 200, which includes a step for mounting wiring structure 10.

Process for Manufacturing Wiring Structure

Wiring structure 10 is manufactured by a process shown in FIG. 4, the same as in the first embodiment, for example. However, step (S16) of FIG. 4 for obtaining individual units is not conducted. Instead, wiring structure 10 is mounted in main wiring board 200 in such a state as shown in FIG. 5H, for example. Also, support sheet 1003 is not used in the present embodiment.

Main wiring board 200 is manufactured, while wiring structure 10 is mounted in main wiring board 200 to manufacture wiring board 100 of the present embodiment. Wiring board 100 is manufactured by a process shown in FIG. 12, for example.

Process for Manufacturing Wiring Board

Figure 12:
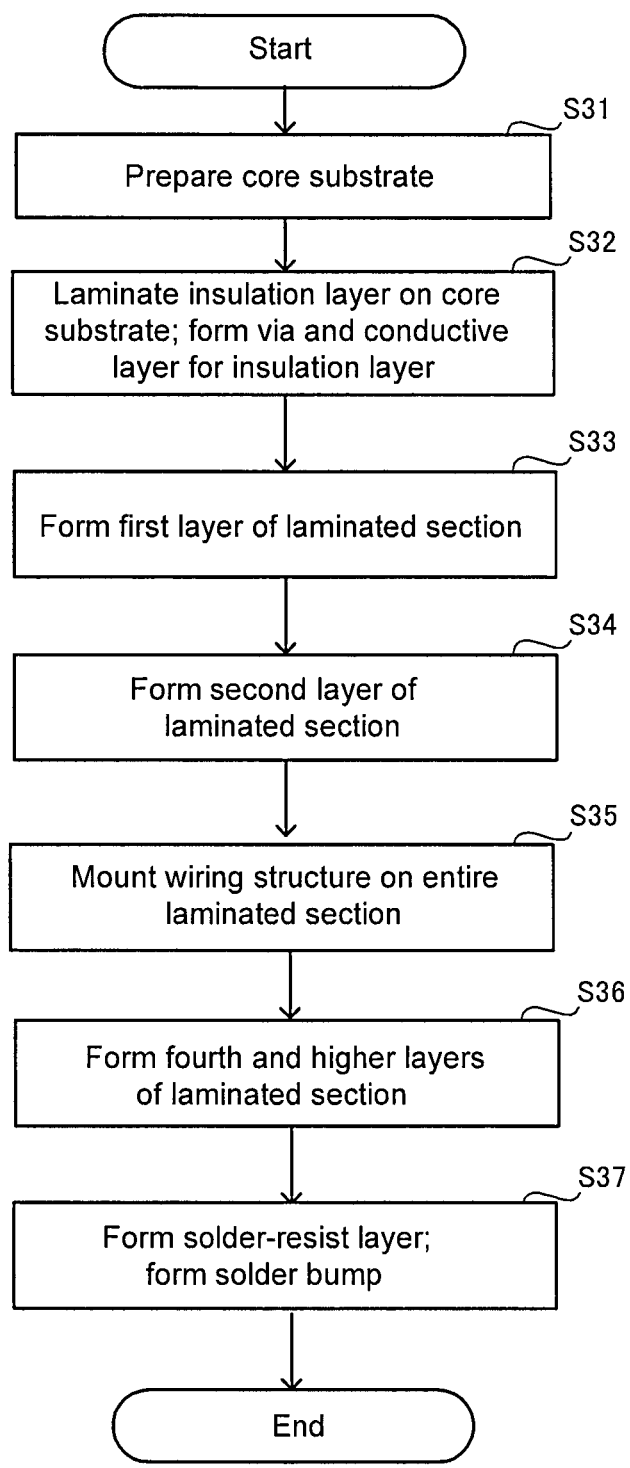
FIG. 12 is a flowchart showing the process for manufacturing a wiring board according to the second embodiment.

In the present embodiment, wiring board 100 is manufactured following the steps up to step (S24) of the processing flow in the first embodiment shown in FIG. 6 (up to step (S34) of FIG. 12 in the present embodiment). Namely, since wiring board 100 of the present embodiment is manufactured following the same steps as in FIGS. 7A~7J of the first embodiment, their descriptions are omitted here.

Figure 13A:
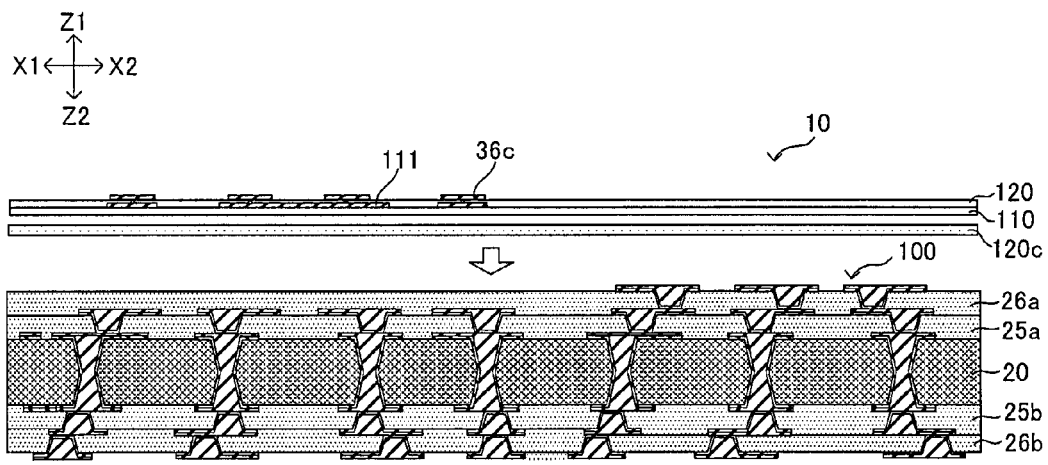
FIG. 13A is a view to illustrate a step in a method for manufacturing a wiring board shown in FIG. 12.
Figure 13B:
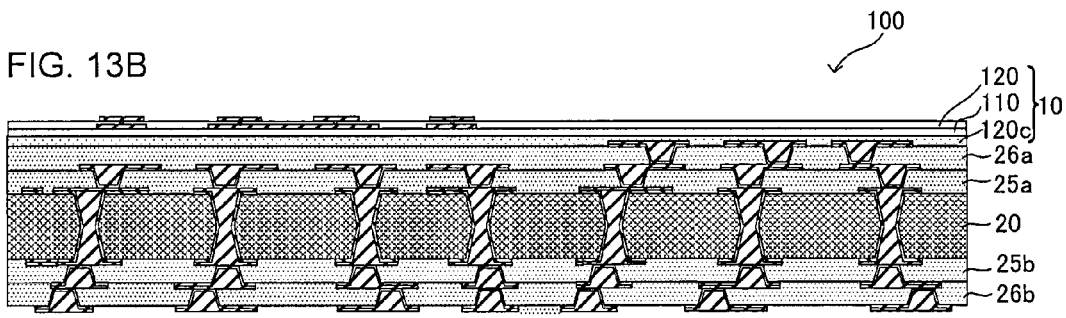
FIG. 13B is a view to illustrate a step in a method for manufacturing a wiring board shown in FIG. 12.

In step (S35) after step (S34) of FIG. 12 (step (S24) of FIG. 6), wiring structure 10 (without support sheet 1003) is mounted on the entire region of interlayer insulation layer (26a) with adhesive layer (120c) placed in between as shown in FIG. 13A, thus achieving the state shown in FIG. 13B.

Figure 13C:
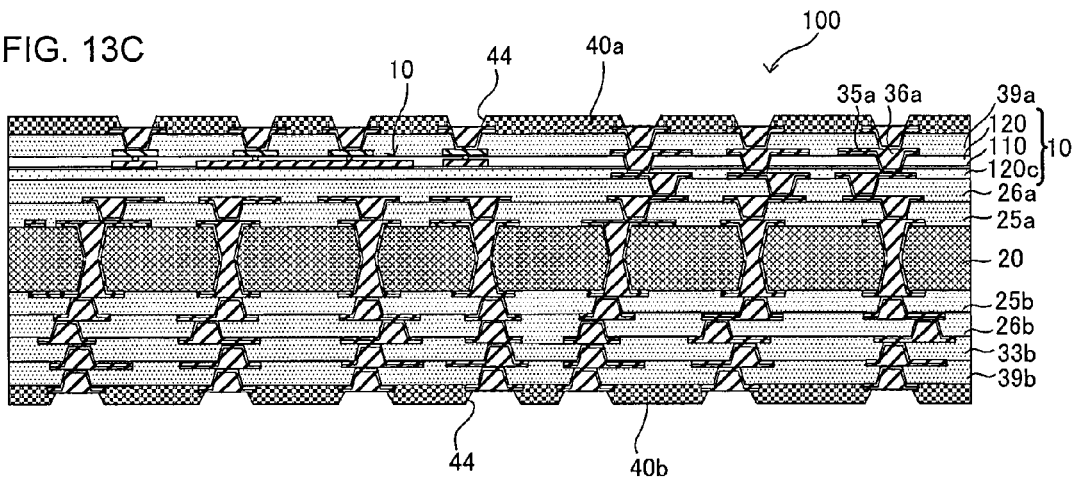
FIG. 13C is a view to illustrate a step in a method for manufacturing a wiring board shown in FIG. 12.

In step (S36) of FIG. 12, interlayer insulation layers (39a, 39b) are laminated on wiring structure 10 and interlayer insulation layer (33b) as shown in FIG. 13C. Then, the above steps are repeated. Accordingly, from the first-surface (F) side of core substrate 20, wiring structure 10 is laminated on interlayer insulation layer (26a). After that, solder-resist layers (40a, 40b) with opening portions 44 are formed on both surfaces of the substrate. Here, upper surfaces of conductive layers (37c, 37d) and via conductors (38c, 38d) exposed from opening portions 44 work as solder pads.

Figure 13D:
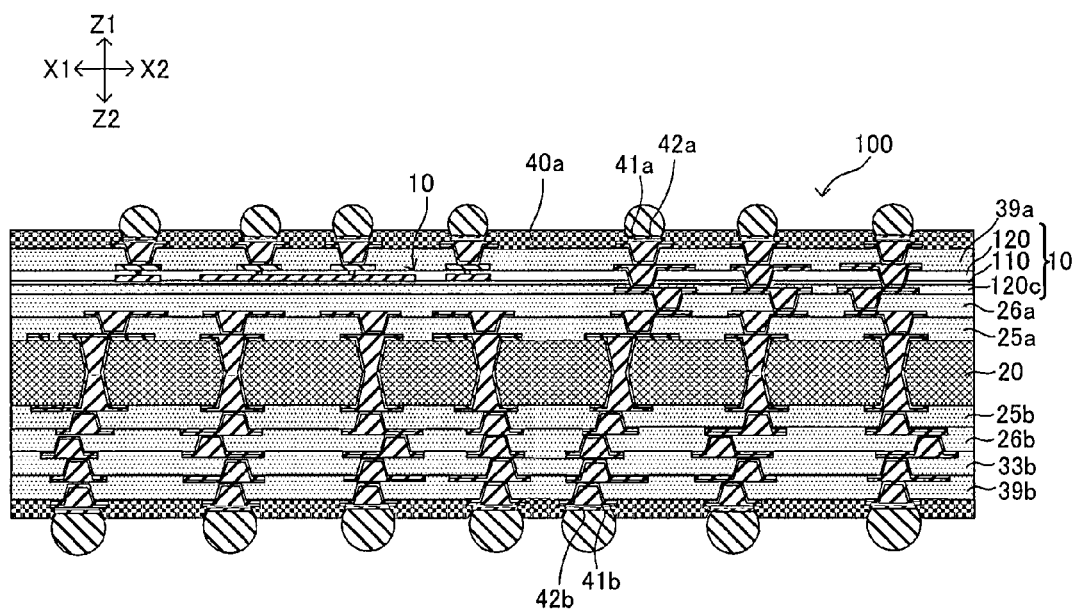
FIG. 13D is a view to illustrate a step in a method for manufacturing a wiring board shown in FIG. 12.

In step (S37) of FIG. 12, nickel-plated layers (41a, 41b) are formed on solder pads, and gold-plated layers (42a, 42b) are further formed on nickel-plated layers (41a, 41b) as shown in FIG. 13D. Instead of nickel-gold layers, nickel-palladium-gold layers may also be formed. Then, solder balls are loaded in opening portions 44 and a reflow is conducted to form solder bumps (43a) on the first-surface (upper-surface) side and solder bumps (43b) on the second-surface (lower-surface) side. Accordingly, wiring board 100 is completed as a multilayer printed wiring board.

In each of the above embodiments and modified examples, the number of conductive layers formed on the first-surface (F1) side of core substrate 20 and the number of conductive layers formed on the second-surface (F2) side of core substrate 20 are three and four respectively. However, that is not the only option, and the number of layers (number of conductive layers) of a wiring board, to which the above structures are applied, is modified freely within a scope for practical use.

Third Embodiment

Figure 14A:
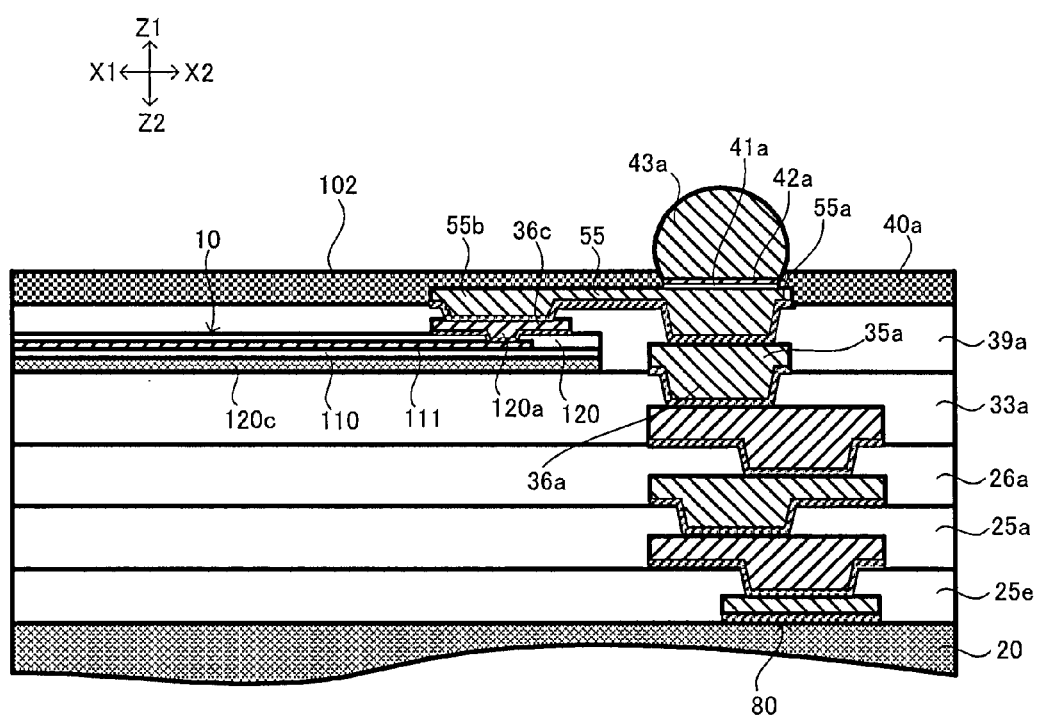
FIG. 14A is a cross-sectional view showing a main part of a wiring board according to a third embodiment (corresponding to the (E-E) cross section of FIG. 14B)

In wiring board 102 of the present embodiment, main wiring board 202, wiring structure 10 in the above first embodiment, and electrical wiring 55 formed on interlayer insulation layer (39a) are used as shown in FIG. 14A. Solder bumps are not formed directly on wiring structure 10, and wiring structure 10 is electrically connected to an outside semiconductor chip (not shown) using solder bumps (43a) formed on electrical wiring 55. Except for such modifications, the rest of the structure and functions are the same as those of wiring board 100 in the first embodiment and its modified examples. Thus, except for the following description, other descriptions are omitted here by applying the same reference numbers for the corresponding portions.

In wiring board 102 of the present embodiment, interlayer insulation layers (25e, 25a, 26a, 33a, 39a) are laminated in that order on core substrate 20, and the uppermost layer is covered with solder-resist layer (40a). Wiring structure 10 is built into interlayer insulation layer (39a), which is positioned directly under solder-resist layer (40a).

Figure 14B:
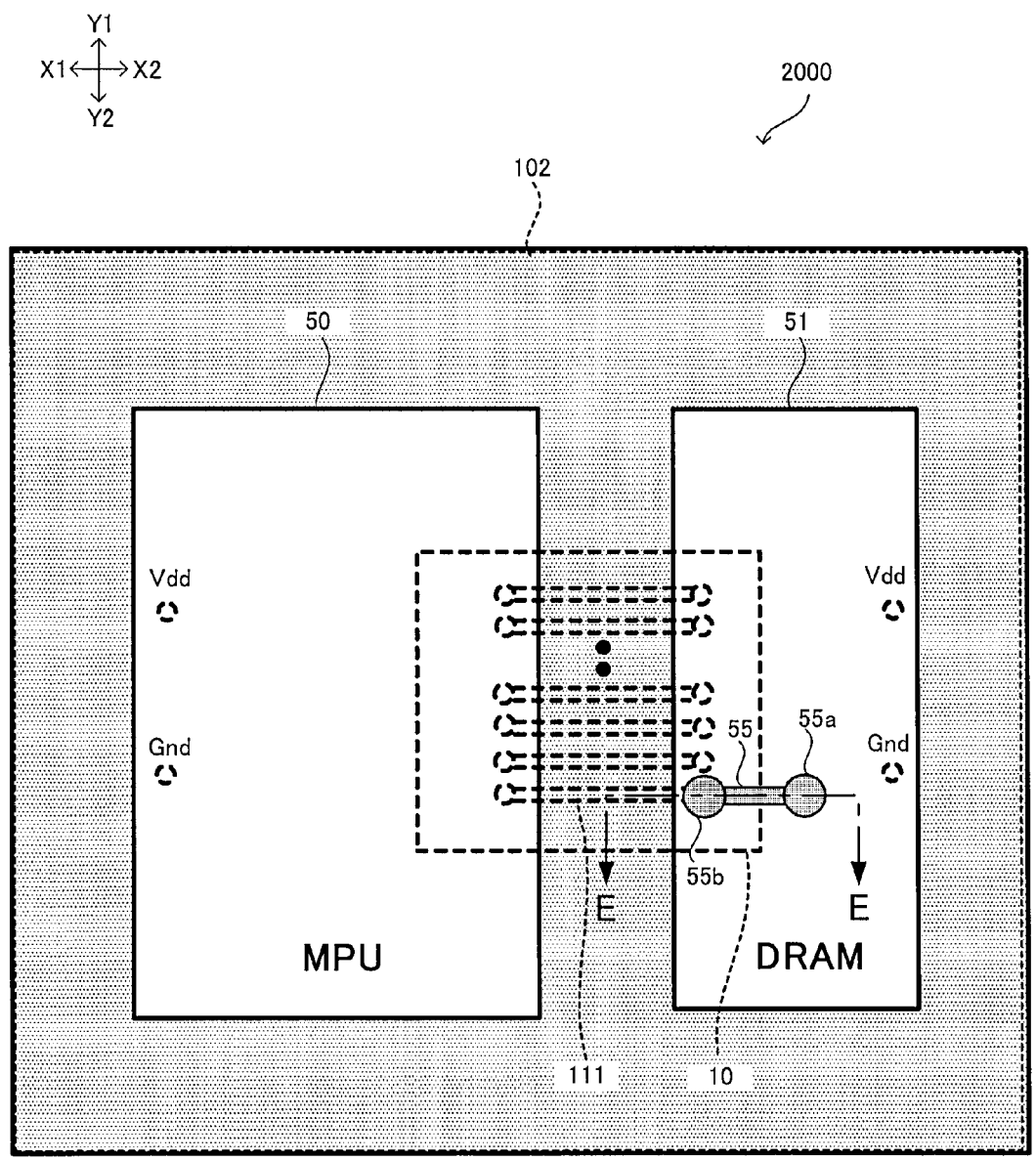
FIG. 14B is a plan view showing a main part of a wiring board according to the third embodiment.

In the present embodiment, conductive pad (55a) in the center of a memory (DRAM) and conductive pad (55b) on wiring structure 10 are electrically connected through electrical wiring 55, as shown in FIG. 14B.

Fourth Embodiment

Figure 15:
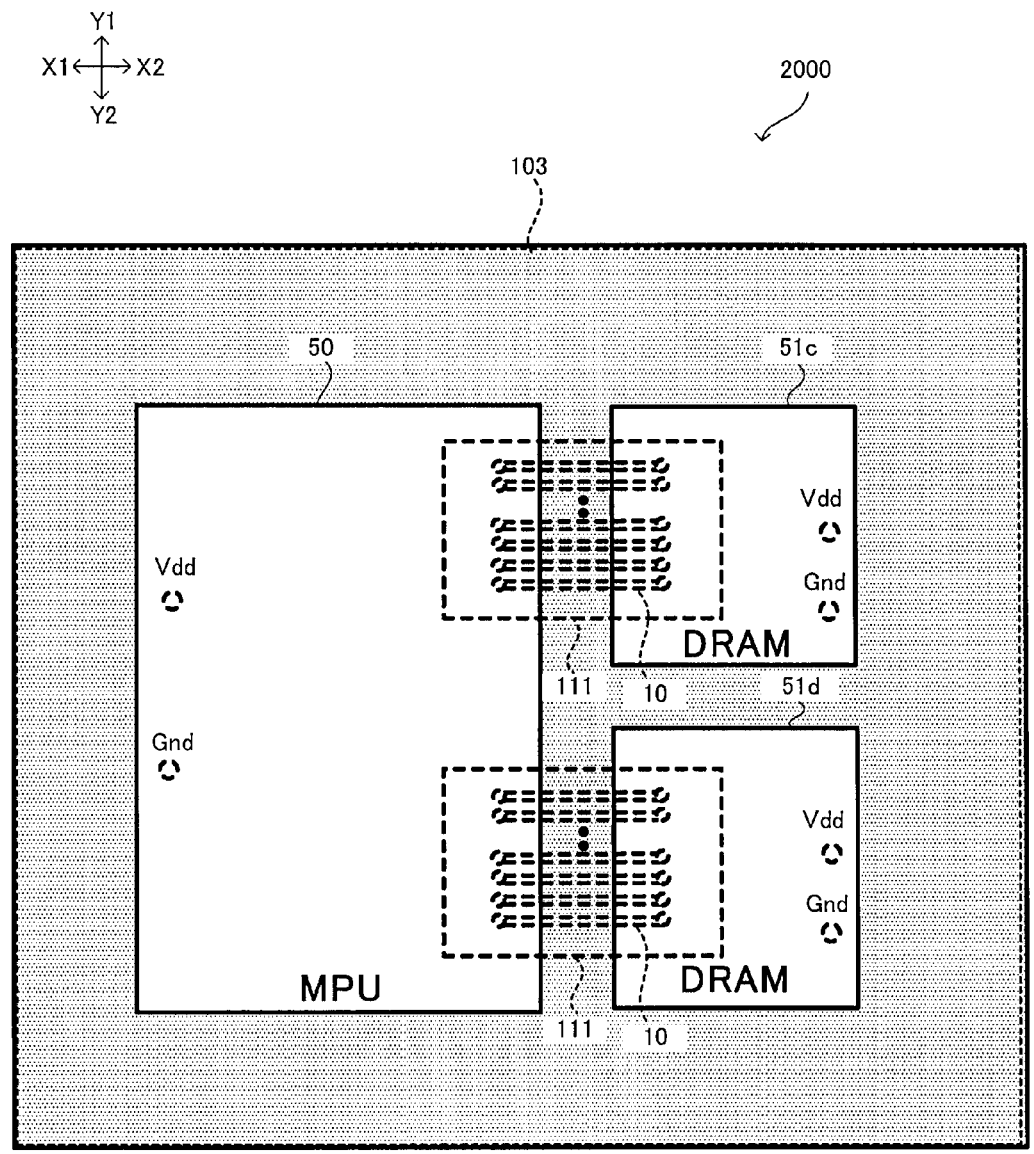
FIG. 15 is a plan view showing a main part of a wiring board according to a fourth embodiment.

As shown in FIG. 15, two wiring structures 10 (two in FIG. 15) are formed in wiring board 103 of the present embodiment. Except that MPU 50 and two DRAMs (51c, 51d) are connected by two wiring structures 10, the rest is the same as with wiring board 100 according to the first embodiment and modified examples. Thus, a detailed description of the corresponding portions is omitted here by applying the same reference numbers.

Using such connections, electrical connection reliability with MPU 50 and two DRAMs (51c, 51d) is enhanced compared with when only one wiring structure 10 is used. Namely, wiring structure 10 corresponding to characteristics of DRAMs (51c, 51d) (wiring pitch, wiring width, etc.) can be used exclusively, for example, so that accuracy in electrical connections improves. As a result, maximum performance of DRAMs (51c, 51d) connected to MPU 50 is achieved.

Fifth Embodiment

Figure 16:
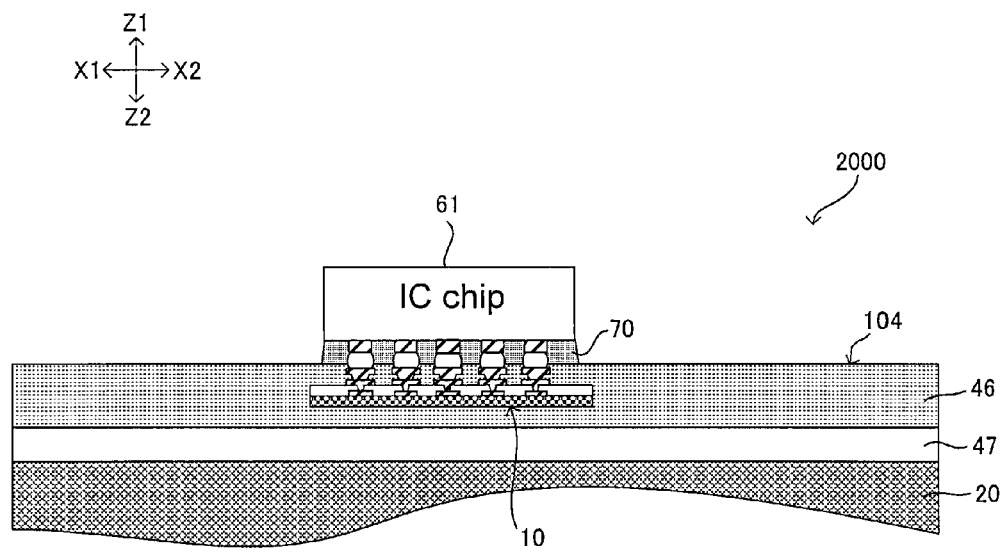
FIG. 16 is a cross-sectional view showing a main part of a wiring board according to a fifth embodiment.

As shown in FIG. 16, in wiring board 104 of the present embodiment, wiring structure 10 used in the above first through fourth embodiments and modified examples is built into insulation layer 46 formed as the uppermost layer of wiring board 104, while electrically connected to IC chip 61 provided on insulation layer 46. Here, wiring structure 10 is used as an electronic component exclusively for IC chip 61.

In wiring board 104, interlayer insulation layer 47 and insulation layer 46 are formed in that order on core substrate 20. The space between IC chip 61 and insulation layer 46 is sealed with underfill resin 70.

In the present embodiment, wiring structure 10 is manufactured by a process of its own, separate from wiring board 104, and is built into wiring board 104. Therefore, wiring structure 10 is designed and manufactured exclusively corresponding to the characteristics of IC chip 61 (wiring pitch, wiring width, etc.), and is built into wiring board 104 to be electrically connected to IC chip 61. As a result, defects in wiring structure 10 are reduced, and the production yield of wiring board 104 is improved accordingly.

Furthermore, a process for manufacturing a wiring board related to the present invention is not limited to the order and contents described in each of the embodiments and modified examples. Such order and contents may be freely modified within a scope that does not deviate from the gist of the present invention. Also, some step may be omitted depending on usage or the like.

Each of the above embodiments and modified examples may be combined freely. An appropriate combination may be selected depending on usage or the like. Also, some elements may be omitted as needed from each of the above embodiments and modified examples depending on the situation.

A wiring board according to one aspect of the present invention is characterized by the following: a first insulation layer; a first conductive pattern formed on the first insulation layer; a second insulation layer formed on the first insulation layer and on the first conductive pattern; a wiring structure positioned on the first insulation layer and having a third insulation layer and a second conductive pattern on the third insulation layer; a third conductive pattern formed on the second insulation layer; and a via conductor formed in the second insulation layer and connecting the first conductive pattern and the third conductive pattern.

The pattern width of the second conductive pattern may be smaller than the pattern width of the first conductive pattern.

The distance between the adjacent second conductive patterns may be smaller than the distance between the adjacent first conductive patterns.

The upper surface of the first conductive pattern and the upper surface of the second conductive pattern may be positioned on the same plane.

The wiring structure may further include a fourth insulation layer formed on the third insulation layer and covering the second conductive pattern, a via conductor penetrating through the fourth insulation layer, and a conductive pad connected to the via conductor.

An adhesive layer may be formed between the first insulation layer and the wiring structure.

Conductive pads may be formed on the fourth insulation layer to be connected to mounting pads for mounting a first semiconductor element and a second semiconductor element.

The mounting pads may include first pads connected to the first semiconductor element and second pads connected to the second semiconductor element, and the distance between the first pads is preferred to be smaller than the distance between the second pads.

The second conductive pattern may be a signal line connecting the first semiconductor element and the second semiconductor element.

The L/S (line/space) of the second conductive pattern may be 1 μm/1 μm or greater but 5 μm/5 μm or less.

The wiring structure may cover the first insulation layer completely.

The second conductive pattern of the wiring structure may be connected to the third conductive pattern by electrical wiring formed above the wiring structure, and that the second conductive pattern be electrically connected to an outside semiconductor chip through the electrical wiring and the third conductive pattern.

The wiring board may have at least two of the wiring structures, and that a semiconductor chip on the wiring board be electrically connected to different semiconductor chips through separate wiring structures.

The wiring structure may be built into an uppermost insulation layer of the wiring board, and be electrically connected to a semiconductor chip provided on the insulation layer.

A method for manufacturing a wiring board according to another aspect of the present invention is characterized by the following: forming a first conductive pattern on a first insulation layer; forming a second insulation layer on the first insulation layer and on the first conductive pattern; forming a via conductor in the second insulation layer; forming a third conductive pattern on the second insulation layer; on the first insulation layer, positioning a wiring structure having a third insulation layer and a second conductive pattern on the third insulation layer; and connecting the third conductive pattern and the first conductive pattern by a via conductor in the second insulation layer.

Wiring boards according to the embodiments of the present invention are suitable as package substrates for mounting multiple semiconductor elements (dies). Also, manufacturing methods according to the embodiments of the present invention are suitable for manufacturing such package substrates.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a first insulation layer;
   a second insulation layer formed on the first insulation layer;
   a wiring structure interposed between the first insulation layer and the second insulation layer and comprising an insulation layer and a plurality of conductive patterns formed on the insulation layer;
   a plurality of conductive patterns formed on the second insulation layer; and
   a via conductor formed through the second insulation layer and connected to one of the conductive patterns on the second insulation layer,
   wherein the wiring structure further comprises an outer insulation layer formed on the insulation layer and covering the conductive patterns in the wiring structure, a via conductor penetrating through the outer insulation layer and a conductive pad connected to the via conductor.

2. The wiring board according to claim 1, further comprising a plurality of first conductive patterns formed on the first insulation layer, wherein the via conductor is connecting one of the first conductive patterns and one of the conductive patterns on the second insulation layer, and each of the conductive patterns in the wiring structure has a pattern width which is set smaller than a pattern width of each of the first conductive patterns.

3. The wiring board according to claim 1, further comprising a plurality of first conductive patterns formed on the first insulation layer, wherein the via conductor is connecting one of the first conductive patterns and one of the conductive patterns on the second insulation layer, and the conductive patterns in the wiring structure are formed such, that a distance set between the conductive patterns in the wiring structure is set smaller than a distance set between the first conductive patterns.

4. The wiring board according to claim 1, further comprising a plurality of first conductive patterns formed on the first insulation layer, wherein the first conductive patterns and the conductive patterns in the wiring structure are formed such that the first conductive patterns and the conductive patterns in the wiring structure have upper surfaces on the same plane.

5. The wiring board according to claim 1, further comprising an adhesive layer interposed between the first insulation layer and the wiring structure such that the adhesive layer is adhering the wiring structure to the first insulation layer.

6. The wiring board according to claim 1, further comprising a plurality of mounting pads formed on the second insulation layer, wherein the plurality of mounting pads is positioned to mount a plurality of semiconductor elements, and the wiring structure includes a plurality of conductive pads such that the conductive pads are positioned to be connected to the plurality of mounting pads on the second insulation layer.

7. The wiring board according to claim 6, further comprising:
   a first semiconductor element of the plurality of semiconductor elements; and
   a second semiconductor element of the plurality of semiconductor elements,
   wherein the plurality of mounting pads include a plurality of first pads connected to the first semiconductor element and a plurality of second pads connected to the second semiconductor element, and the plurality of first pads is positioned such that a distance set between the first pads is set smaller than a distance set between the second pads.

8. The wiring board according to claim 1, wherein the plurality of conductive patterns in the wiring structure forms at least one signal line which connects a first semiconductor element and a second semiconductor element.

9. The wiring board according to claim 1, wherein each of the conductive patterns in the wiring structure has a line/space ratio, L/S, which is set in a range of from 1 μm/1 μm or greater to 5 μm/5 μm or less.

10. The wiring board according to claim 1, wherein the wiring structure is interposed between the first insulation layer and the second insulation layer such that the wiring structure is covering a surface of the first insulation layer entirely.

11. The wiring board according to claim 1, further comprising a wiring line formed above the wiring structure and connecting one of the conductive patterns in the wiring structure and one of the conductive patterns on the second insulation layer such that the one of the conductive patterns in the wiring structure is electrically connected to an outside semiconductor element through the wiring line and the one of the conductive patterns on the second insulation layer.

12. The wiring board according to claim 1, further comprising a plurality of semiconductor elements, wherein the wiring structure is formed in a plurality such that one of the semiconductor elements is electrically connected to other ones of the semiconductor elements through the plurality of wiring structures, respectively.

13. The wiring board according to claim 1, further comprising a semiconductor element mounted on the second insulation layer, wherein the second insulation layer forms an outermost insulation layer, and the wiring structure is formed in a portion of the second insulation layer and is electrically connected to the semiconductor element.

14. The wiring board according to claim 1, wherein the wiring structure is positioned on a portion of a surface of the first insulation layer such that the second insulation layer is extending over the surface of the first insulation layer and covering the wiring structure.

15. The wiring board according to claim 10, further comprising a plurality of mounting pads formed on the second insulation layer, wherein the plurality of mounting pads is positioned to mount a plurality of semiconductor elements, and the wiring structure includes a plurality of conductive pads such that the conductive pads are positioned to be connected to the plurality of mounting pads on the second insulation layer.

16. The wiring board according to claim 10, wherein the plurality of conductive patterns in the wiring structure forms at least one signal line which connects a first semiconductor element and a second semiconductor element.

17. The wiring board according to claim 10, further comprising a wiring line formed above the wiring structure and connecting one of the conductive patterns in the wiring structure and one of the conductive patterns on the second insulation layer such that the one of the conductive patterns in the wiring structure is electrically connected to an outside semiconductor element through the wiring line and the one of the conductive patterns on the second insulation layer.

18. The wiring board according to claim 14, further comprising a plurality of mounting pads formed on the second insulation layer, wherein the plurality of mounting pads is positioned to mount a plurality of semiconductor elements, and the wiring structure includes a plurality of conductive pads such that the conductive pads are positioned to be connected to the plurality of mounting pads on the second insulation layer.

19. The wiring board according to claim 14, wherein the plurality of conductive patterns in the wiring structure forms at least one signal line which connects a first semiconductor element and a second semiconductor element.

20. The wiring board according to claim 14, further comprising a wiring line formed above the wiring structure and connecting one of the conductive patterns in the wiring structure and one of the conductive patterns on the second insulation layer such that the one of the conductive patterns in the wiring structure is electrically connected to an outside semiconductor element through the wiring line and the one of the conductive patterns on the second insulation layer.

* * * * *